US011984453B2

(12) United States Patent
Wang et al.

(10) Patent No.: US 11,984,453 B2
(45) Date of Patent: May 14, 2024

(54) ARRAY SUBSTRATE, DISPLAY PANEL AND ELECTRONIC DEVICE

(71) Applicant: BOE Technology Group Co., Ltd., Beijing (CN)

(72) Inventors: Jiguo Wang, Beijing (CN); Jian Sun, Beijing (CN); Zhao Zhang, Beijing (CN); Liang Tian, Beijing (CN); Weida Qin, Beijing (CN); Zhen Wang, Beijing (CN); Han Zhang, Beijing (CN); Wenwen Qin, Beijing (CN); Xiaoyan Yang, Beijing (CN); Yue Shan, Beijing (CN); Wei Yan, Beijing (CN); Jian Zhang, Beijing (CN); Deshuai Wang, Beijing (CN); Yadong Zhang, Beijing (CN); Jiantao Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 56 days.

(21) Appl. No.: 17/622,708

(22) PCT Filed: Jan. 29, 2021

(86) PCT No.: PCT/CN2021/074475
§ 371 (c)(1),
(2) Date: Dec. 23, 2021

(87) PCT Pub. No.: WO2022/160279
PCT Pub. Date: Aug. 4, 2022

(65) Prior Publication Data
US 2023/0154933 A1   May 18, 2023

(51) Int. Cl.
*G02F 1/1362* (2006.01)
*G02F 1/1368* (2006.01)
*H01L 27/12* (2006.01)

(52) U.S. Cl.
CPC ...... *H01L 27/124* (2013.01); *G02F 1/136209* (2013.01); *G02F 1/136213* (2013.01);
(Continued)

(58) Field of Classification Search
CPC ............... H01L 27/124; H01L 27/1255; G02F 1/136209; G02F 1/136213;
(Continued)

(56) References Cited

U.S. PATENT DOCUMENTS 6,522,375 B1   2/2003   Jang et al.
6,803,174 B2   10/2004  Jang et al.
(Continued)

FOREIGN PATENT DOCUMENTS

CN   1266254 A   9/2000
CN   1407374 A   4/2003
(Continued)

OTHER PUBLICATIONS

Written Opinion of the International Searching Authority issued in International Application No. PCT/CN2021/074475 dated Nov. 1, 2021, (4p).

*Primary Examiner* — James A Dudek
(74) *Attorney, Agent, or Firm* — Arch & Lake LLP

(57) ABSTRACT

An array substrate includes: a first substrate (10), including a plurality of sub-pixel regions (101) arranged in an array along a row direction (X) and a column direction (Y); a pixel circuit layer, including a plurality of sub-pixel circuits; a planarization layer (17), provided with a first via hole (170) located in the sub-pixel regions (101), and includes at least one pattern portion (171), the pattern portion (171) includes a plurality of pattern units (171*a*) arranged in an array along the row direction (X) and the column direction (Y); and a reflective electrode layer, wherein the reflective electrode layer includes a plurality of reflective electrodes (18) that are
(Continued)

mutually disconnected, each of the reflective electrodes (18) is located in one of the sub-pixel regions (101) and is electrically connected to the sub-pixel circuit through the first via hole (170).

18 Claims, 19 Drawing Sheets

(52) U.S. Cl.
CPC .... *G02F 1/136222* (2021.01); *G02F 1/13629* (2021.01); *G02F 1/1368* (2013.01); *H01L 27/1255* (2013.01)

(58) Field of Classification Search
CPC ........... G02F 1/136222; G02F 1/13629; G02F 1/1368; G02F 1/133553
See application file for complete search history.

(56) References Cited

U.S. PATENT DOCUMENTS

| | | |
|---|---|---|
| 6,947,109 B2 | 9/2005 | Lee |
| 7,450,197 B2 | 11/2008 | Lee |
| 11,079,621 B2 | 8/2021 | Zheng et al. |
| 2001/0013913 A1* | 8/2001 | Young .............. G02F 1/136227 349/113 |
| 2003/0039925 A1* | 2/2003 | Jang ................. G02F 1/133553 430/324 |
| 2004/0012736 A1* | 1/2004 | Jeon ................. G02F 1/133553 349/113 |
| 2004/0051826 A1 | 3/2004 | Lee |
| 2004/0141113 A1 | 7/2004 | Yun |
| 2006/0017869 A1 | 1/2006 | Lee |
| 2007/0188680 A1 | 8/2007 | Jang et al. |
| 2011/0013127 A1* | 1/2011 | Takahashi ......... G02F 1/133504 349/112 |
| 2015/0362776 A1* | 12/2015 | Jikumaru ............... H10K 59/40 349/12 |
| 2020/0219906 A1 | 7/2020 | Zheng et al. |

FOREIGN PATENT DOCUMENTS

| | | |
|---|---|---|
| CN | 1675581 A | 9/2005 |
| CN | 1853117 A | 10/2006 |
| CN | 102236230 A | 11/2011 |
| CN | 107403809 A | 11/2017 |
| CN | 109524422 A | 3/2019 |
| CN | 111338144 A | 6/2020 |
| IN | 111338144 A | 6/2020 |
| JP | 2002229067 A | 8/2002 |
| JP | 2007264276 A | 10/2007 |
| KR | 20060022806 A | 3/2006 |
| WO | 2004027498 A1 | 4/2004 |

* cited by examiner

ARRAY SUBSTRATE, DISPLAY PANEL AND ELECTRONIC DEVICE

CROSS-REFERENCE TO RELATED APPLICATION

This application is the U.S. national phase application of PCT Application No. PCT/CN2021/074475, filed Jan. 29, 2021, the entire contents of which are incorporated herein by reference for all purposes.

TECHNICAL FIELD

The disclosure relates to the field of display technology, and in particular to an array substrate, a display panel and an electronic device.

BACKGROUND

Nowadays, traditional ink-type electronic paper is gradually unable to meet market demand due to technical bottlenecks such as high price and single color. Total reflection LCD (Liquid Crystal Display) has great market potential in smart retail, electronic tags, e-books and other fields due to its advantages of low power consumption, low cost, and multi-color characteristic.

It should be noted that the information disclosed in the background section above is only intended to enhance the understanding of the background of the disclosure, and therefore may include information that does not constitute the prior art known to those of ordinary skill in the art.

SUMMARY

The disclosure is directed to provide an array substrate, a display panel and an electronic device, thereby overcoming, to at least a certain extent, one or more problems caused by limitation or defects in related art.

According to a first aspect of the disclosure, there is provided an array substrate, including:

a first substrate, including a plurality of sub-pixel regions arranged in an array along a row direction and a column direction;

a pixel circuit layer formed on the first substrate, including a plurality of sub-pixel circuits, wherein at least part of the sub-pixel circuits is located in the sub-pixel regions;

a planarization layer formed on the pixel circuit layer, wherein the planarization layer is provided with a first via hole located in the sub-pixel regions, and includes at least one pattern portion, the pattern portion includes a plurality of pattern units arranged in an array along the row direction and the column direction, and the pattern unit is uneven and located at least in the sub-pixel regions; wherein the pattern unit includes a plurality of first bumps arranged along a circumferential direction of the pattern unit and an spacing groove surrounding each of the first bumps, and a part of the spacing groove is shared by two adjacent first bumps in the circumferential direction; and a reflective electrode layer formed on the planarization layer, wherein the reflective electrode layer includes a plurality of reflective electrodes that are mutually disconnected, each of the reflective electrodes is located in one of the sub-pixel regions and is electrically connected to the sub-pixel circuit through the first via hole, and a portion of the reflective electrode corresponding to the pattern unit is in an uneven shape matching the pattern unit.

According to some exemplary embodiments of the disclosure, an orthographic projection of the first bump on the first substrate is a symmetrical pattern, and the symmetrical pattern have at least two symmetry axis including a first symmetry axis and a second symmetry axis that are perpendicular to each other, wherein a length of the first symmetry axis is greater than a length of the second symmetry axis, and the first symmetry axis and the second symmetry axis are perpendicular to a thickness direction of the array substrate.

According to some exemplary embodiments of the disclosure, in the circumferential direction of the pattern unit, extension directions of the first symmetry axis corresponding to two adjacent symmetric patterns intersect with each other.

According to some exemplary embodiments of the disclosure, the circumferential direction of the pattern unit, the extension directions of the first symmetry axis corresponding to two adjacent symmetric patterns are perpendicular to each other.

According to some exemplary embodiments of the disclosure, the pattern unit includes four of the first bumps, and in the circumferential direction of the pattern unit, the first symmetry axis of one of two symmetric patterns corresponding to two adjacent first bumps is collinear with the second symmetry axis of another one of the two symmetric patterns.

According to some exemplary embodiments of the disclosure, in the circumferential direction of the pattern unit, the first symmetry axis of one of two symmetric patterns corresponding to two adjacent first bumps extends in the row direction, and the first symmetry axis of another one of the two symmetric patterns extends in the column direction.

According to some exemplary embodiments of the disclosure, symmetry axes of the symmetry pattern consist of only the first symmetry axis and the second symmetry axis.

According to some exemplary embodiments of the disclosure, the symmetrical pattern is rhombus, rectangle, ellipse or octagon.

According to some exemplary embodiments of the disclosure, a ratio of the length of the first symmetry axis of the symmetric pattern to the length of the second symmetry axis of the first bump is 1.5 to 2.5.

According to some exemplary embodiments of the disclosure, the length of the second symmetry axis is 6 µm to 10 µm.

According to some exemplary embodiments of the disclosure, the pattern unit further includes a second bump located within a central area surrounded by each of the first bumps; and wherein a part of each of the spacing grooves in the pattern unit close to the second bump is connected end to end in sequence along the circumferential direction to surround the second bump.

According to some exemplary embodiments of the disclosure, slope angles of the first bump and the second bump are both 6° to 13°.

According to some exemplary embodiments of the disclosure, in the circumferential direction of the pattern unit, a minimum distance between any two adjacent first bumps is a first distance, and the a minimum distance between the second bump and the first bump in the pattern unit is a second distance; and wherein a ratio of the first distance to the second distance is 1 to 1.5.

According to some exemplary embodiments of the disclosure, the second distance is 1.5 µm to 5 µm.

According to some exemplary embodiments of the disclosure, a maximum thickness of the first bump is the same as a maximum thickness of the second bump.

According to some exemplary embodiments of the disclosure, at position of the spacing groove, a thickness of the planarization layer is greater than or equal to 1 μm.

According to some exemplary embodiments of the disclosure, a distance between the first via hole and the spacing groove is greater than or equal to 5 μm.

According to some exemplary embodiments of the disclosure, the first substrate further includes multiple rows of first wiring regions and multiple columns of second wiring regions, the first wiring regions and each row of sub-pixel regions are alternately arranged in the column direction, and the second wiring regions and each column of the sub-pixel regions are alternately arranged in the row direction; and the pixel circuit layer further includes multiple rows of gate lines and multiple columns of data lines, the gate lines are located in the first wiring regions, the data lines are located in the second wiring regions, and the gate lines and the data lines are respectively electrically connected to the sub-pixel circuit.

According to some exemplary embodiments of the disclosure, the sub-pixel circuit includes a storage capacitor and a transistor;

the storage capacitor is located in the sub-pixel region, and includes a first electrode plate and a second electrode plate that are opposite to each other in a thickness direction of the first substrate, the first electrode plate and the gate line are arranged in a same layer and disconnected from each other, the second electrode plate and the data line are arranged in a same layer and disconnected from each other, and the second electrode plate is connected to the reflective electrode through the first via hole;

the transistor includes an active layer, a gate, a source and a drain; the active layer is located at one side of the gate line near the first substrate, and includes a first active portion located in the second wiring region, a second active portion opposite to the first active portion in the row direction, and a third active portion at least located in the sub-pixel region; an orthographic projection of the first active portion on the first substrate at least partially overlaps with an orthographic projection of the gate line on the first substrate; a first end of the first active portion is located at one side of the gate line away from the third active portion, and a second end of the first active portion is connected to a first end of the third active portion; a first end and a second end of the second active portion are respectively located in two adjacent sub-pixel regions in the row direction, the first end of the second active portion is located at one side of the gate line away from the third active portion, and the second end of the second active portion is connected to a second end of the third active portion; and the gate of the transistor is formed by a part of the gate lines overlapping with the first active portion and the second active portion in the thickness direction of the first substrate, the source of the transistor is formed by a part of the data lines overlapping with the first end of the first active portion in the thickness direction of the first substrate, the source is connected to the first end of the first active portion through the second via hole, the drain of the transistor is formed by a part of the second electrode plate overlapping with the first end of the second active portion in the thickness direction of the first substrate, and the drain is connected to the first end of the second active portion through the third via hole.

According to some exemplary embodiments of the disclosure, the first electrode plates of the storage capacitors corresponding to any two adjacent sub-pixel circuits in a same row of the sub-pixel circuits are connected by a common line, and the common line and the first electrode plate are arranged on a same layer.

According to some exemplary embodiments of the disclosure, the planarization layer further includes a non-patterned portion at least located in the first wiring region, the non-patterned portion extends in the row direction, and a surface of the non-patterned portion away from the first substrate is a flat surface.

According to some exemplary embodiments of the disclosure, each of the pattern units in the pattern portion is continuously arranged; and wherein the pattern portion extends in the row direction, and an orthographic projection of the pattern portion on the first substrate at least partially overlaps with each of the sub-pixel regions at a same row as the pattern portion.

According to some exemplary embodiments of the disclosure, there are multiple pattern portions and multiple non-pattern portions, and the pattern portions and the non-pattern portions are alternately arranged in the column direction.

According to a second aspect of the disclosure, there is provided a display panel, including the array substrate according to any embodiment as described above and an opposing substrate arranged in an opposing way with respect to the array substrate.

According to some exemplary embodiments of the disclosure, the opposing substrate includes a second substrate and a spacer located at one side of the second substrate close to the array substrate, an orthographic projection of the spacer on the first substrate at least partially overlaps with an overlapping part between the first wiring region and the second wiring region, and an orthographic projection of a surface of the spacer close to the array substrate on the first substrate falls within an orthographic projection of the non-patterned portion of the planarization layer on the first substrate.

According to some exemplary embodiments of the disclosure, a distance between the surface of the spacer close to the array substrate and the spacing groove of the pattern unit is greater than or equal to 5 μm.

According to some exemplary embodiments of the disclosure, the opposing substrate further includes a shielding layer located between the spacer and the second substrate, the shielding layer is provided with a plurality of opening areas arranged in an array, and an orthographic projection of each of the opening areas on the first substrate falls within one of the sub-pixel regions, and within orthographic projections of the reflective electrode and the pattern portion on the first substrate.

According to some exemplary embodiments of the disclosure, the opposing substrate further includes:

a color film layer located between the spacer and the second substrate, including a plurality of filter blocks at least partially located in the opening areas;

a protective film layer located at one side of the color film layer and the shielding layer away from the second substrate, and located at one side of the spacer close to the second substrate, wherein the protective film layer covers the color film layer and the shielding layer; and a common electrode layer located between the protective film layer and the spacer.

According to a third aspect of the disclosure, there is provided an electronic device including the display panel according to any embodiment as described above.

Other characteristics and advantages of the disclosure will become apparent through the following detailed description, or partly learned through the practice of the disclosure.

It should be understood that the above general description and the following detailed description are only exemplary and explanatory, and cannot limit the disclosure.

BRIEF DESCRIPTION OF THE DRAWINGS

The drawings herein are incorporated into the specification and constitute a part thereof, illustrate embodiments consistent with the disclosure, and are used together with the specification to explain the principle of the disclosure. Obviously, the drawings in the following description are only some embodiments of the disclosure. For those of ordinary skill in the art, other drawings may be obtained based on these drawings without creative work.

Figure 1:
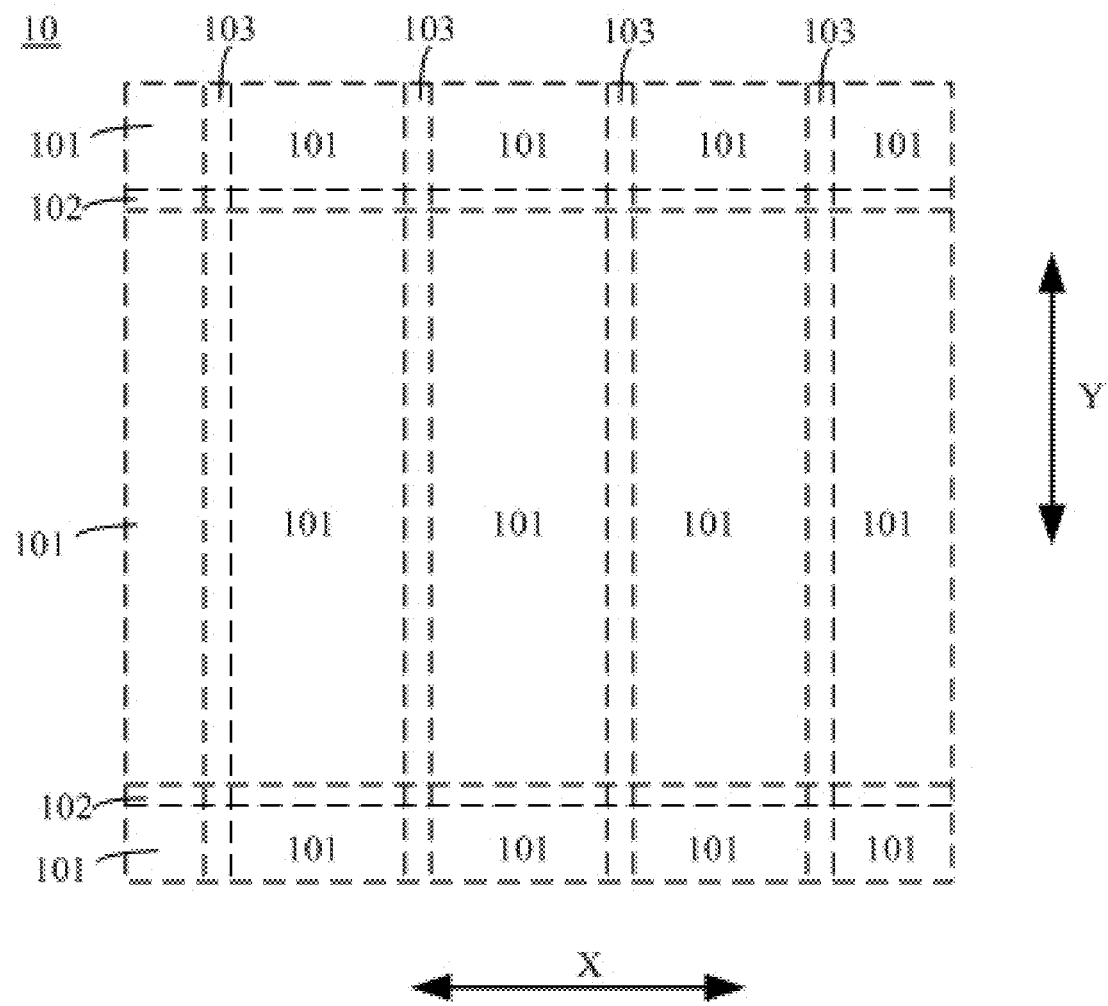
FIG. 1 shows a schematic diagram of the region distribution in the display area of the first substrate in the array substrate according to some embodiments of the disclosure.

Reference signs of main components in the drawings are explained as follows.
10 first substrate
10a glass layer
10b buffer layer
101 sub-pixel region
102 first wiring region
103 second wiring region
11 transistor
110 active layer
1101 first active portion
1102 second active portion
1103 third active portion
111 gate
112 source
113 drain
12 storage capacitor
121 first electrode plate
122 second electrode plate
13 gate line
14 data line
15 gate insulating layer
16 interlayer dielectric layer
160 second via hole
161 third via hole
17 planarization layer
170 first via hole
171 pattern portion
171a pattern unit
1710 first bump
1711 spacing groove
1712 second bump
172 non-patterned portion
18 reflective electrode
19 common line
20 spacer
21 shielding layer
210 opening area
211 shielding region
22 second substrate
23 filter block
24 protective film layer
25 common electrode layer

DETAILED DESCRIPTION

In the following, the technical solutions of the disclosure will be further described in detail through the embodiments and in conjunction with the accompanying drawings. In the specification, the same or similar reference numerals indicate the same or similar components. The following description of the embodiments of the disclosure with reference to the accompanying drawings is intended to explain the general inventive concept of the disclosure, and should not be construed as a limitation to the disclosure.

In addition, in the following detailed description, for the convenience of explanation, many specific details are set forth to provide a comprehensive understanding of the embodiments of the disclosure. However, it is obvious that one or more embodiments can also be implemented without these specific details.

Unless otherwise defined, the technical or scientific terms used in the disclosure shall have the usual meanings understood by those with ordinary skills in the field to which this disclosure belongs. The phrase "first", "second" and the like used in the disclosure do not indicate any order, quantity or importance, but are only used to distinguish different components.

The phrase "including", "having" and the like used in the disclosure mean that the elements or items appearing before the phrase cover the elements or items listed after the phrase and their equivalents, but do not exclude other elements or items.

Nowadays, reflective display technology (abbreviated as RLCD technology) has extremely high application prospects in the field of outdoor and health display. RLCD technology can directly replace the screen light source by reflecting ambient light without backlighting, thereby having significant advantages in terms of eye protection with low blue light, ultra-low power consumption, thin and light body.

In view of above, the embodiments of the disclosure provide an array substrate, which may be applied to the field of reflective display technology. Specifically, as shown in FIG. 1 to FIG. 8, the array substrate may include a first substrate 10, a pixel circuit layer, a planarization layer 17, and a reflective electrode layer.

Figure 21:
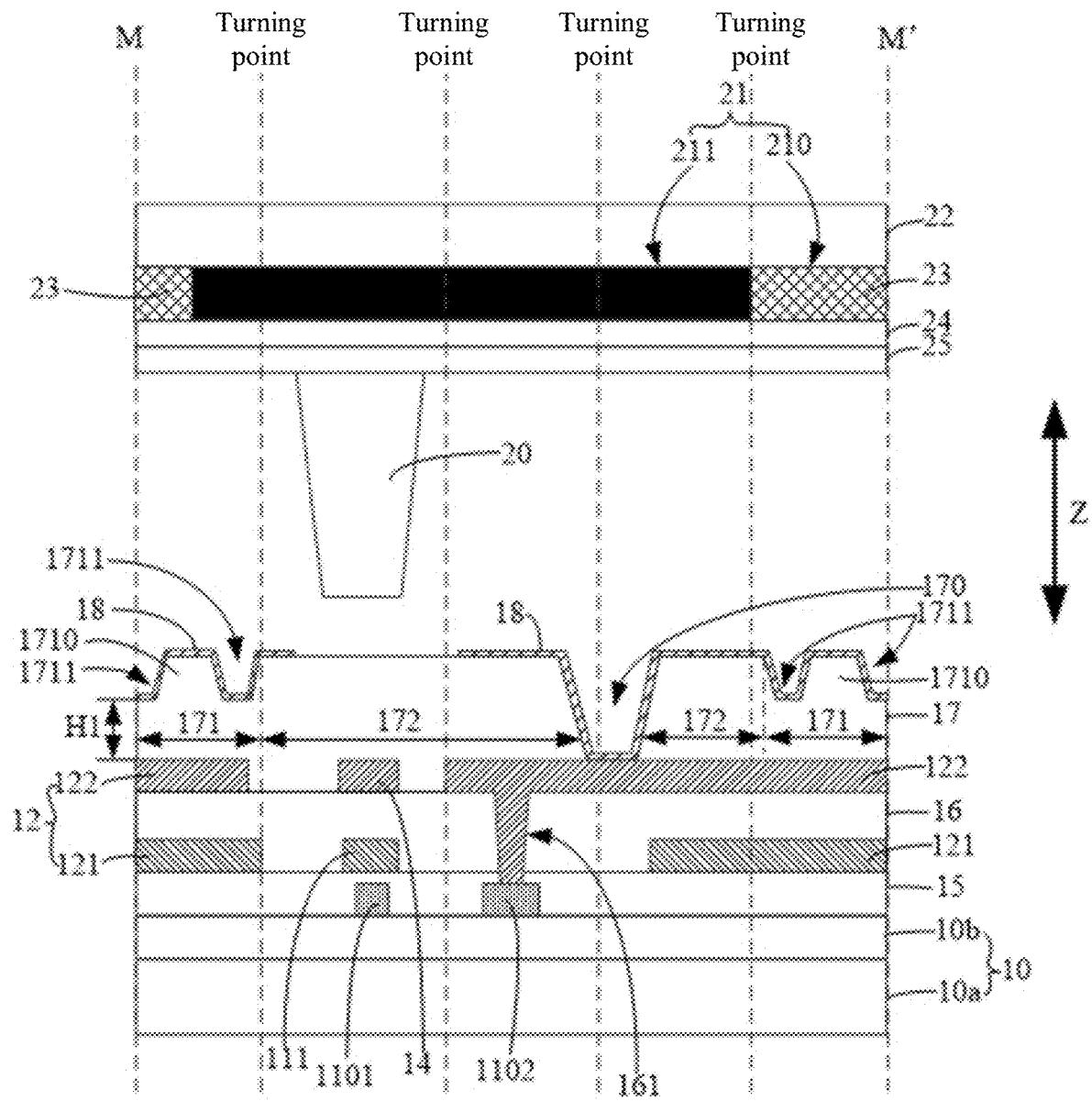
FIG. 21 shows a schematic cross-sectional view along the M-M' direction shown in FIG. 19.
Figure 22:
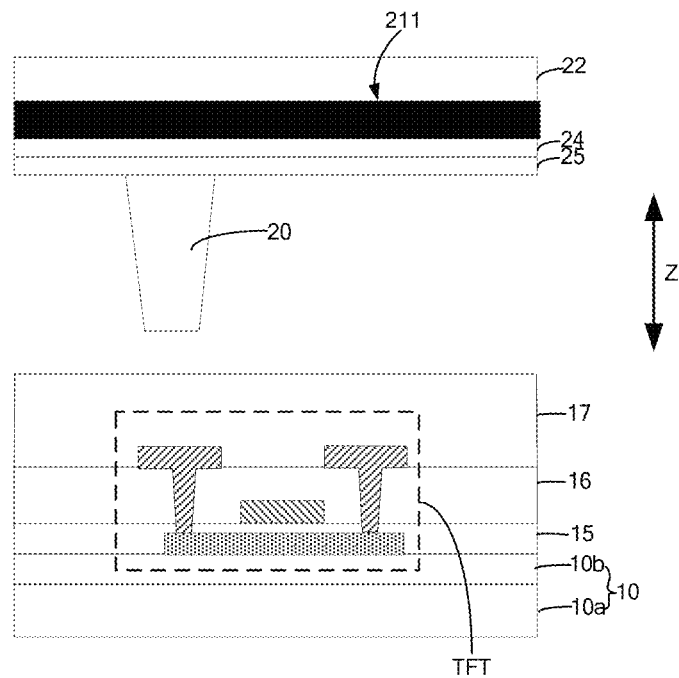
FIG. 22 shows a schematic cross-sectional view of a part of the GOA region according to an embodiment of the disclosure.

The first substrate 10 may be formed in a single-layer structure. For example, the first substrate 10 may be a glass substrate, but is not limited to this, and may also be a PI (polyimide) substrate or the like. It should be noted that the first substrate 10 is not limited to the single-layer structure, and it may also be a multilayer composite structure. For example, as shown in FIG. 21 and FIG. 22, the first substrate 10 may include a glass layer 10*a* and a buffer layer 10*b* on the glass layer 10*a*. The buffer layer 10*b* may be an inorganic insulating layer, including silicon oxide, silicon nitride, silicon oxynitride, and the like. It should be understood that when the first substrate 10 is formed in the multilayer composite structure, it is not limited to including the aforementioned glass layer 10*a* and buffer layer 10*b*, and may also include other layers depending on the specific circumstances.

In some embodiments of the disclosure, the first substrate 10 may include a display area and a non-display area arranged around the display area. In some embodiments, as shown in FIG. 1, the display area may include a plurality of sub-pixel regions 101 arranged in an array along the row direction X and the column direction Y, multiple rows of first wiring regions 102, and multiple columns of second wiring regions 103. The first wiring regions 102 and each row of sub-pixel regions 101 are alternately arranged in the column direction Y, and the second wiring regions 103 and each column of sub-pixel regions 101 are alternately arranged in the row direction X. The non-display area may include a GOA (i.e., gate drive circuit) region, a bonding region, and the like.

The pixel circuit layer may be formed on the first substrate 10. For example, when the first substrate 10 includes a glass layer 10*a* and a buffer layer 10*b*, the pixel circuit layer may be located on one side of the buffer layer 10*b* away from the glass layer 10*a*. The pixel circuit layer may include multiple rows of gate lines 13, multiple columns of data lines 14, and multiple sub-pixel circuits. The gate lines 13 and the data lines 14 are respectively electrically connected to the sub-pixel circuits, as shown in FIG. 1 to FIG. 7.

Figure 3:
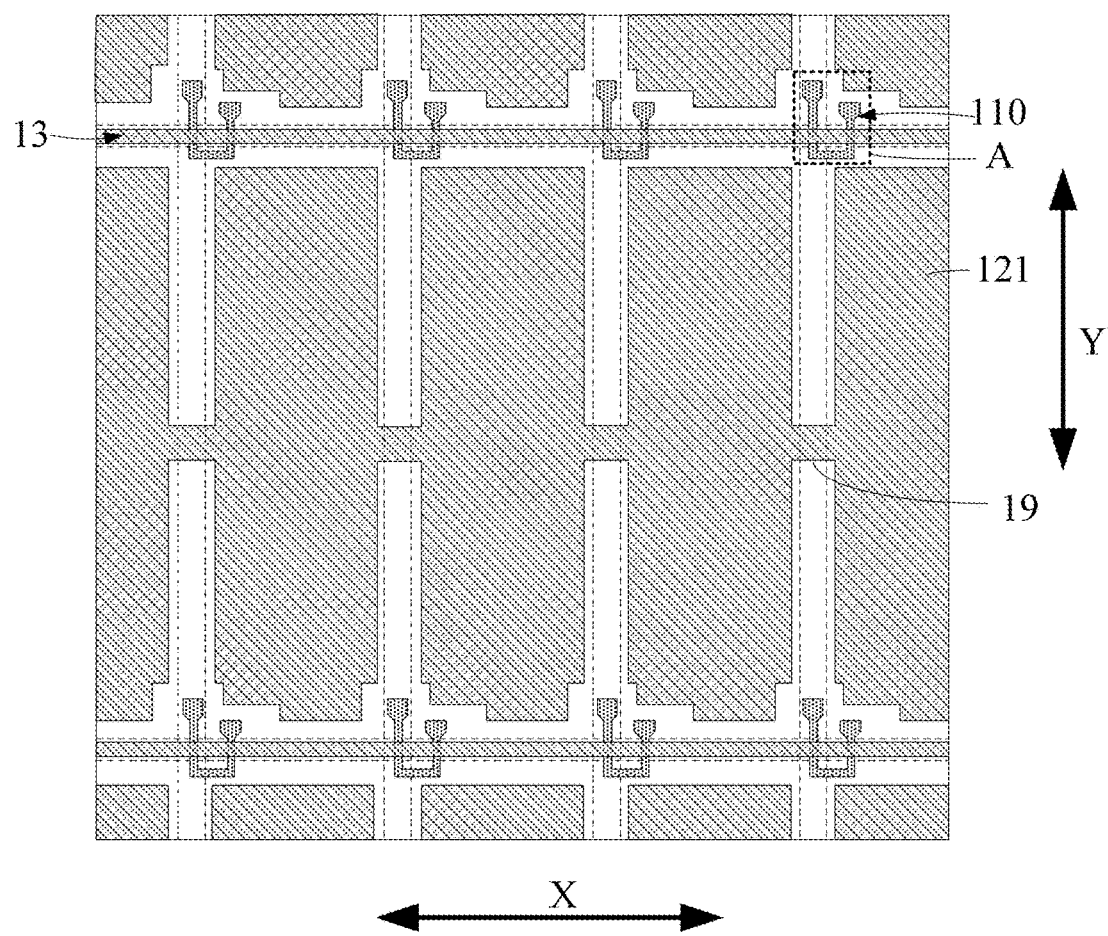
FIG. 3 shows a schematic structural diagram of forming a gate line, a first electrode plate and a common line on the first substrate shown in FIG. 2.

In some embodiments of the disclosure, the gate lines 13 may extend in the row direction X and are located in the first wiring region 102. For example, as shown in FIG. 3, each row of the first wiring region 102 may be provided with a row of gate line 13, but not limited thereto. The first wiring region 102 located between two adjacent rows of sub-pixel regions 101 may also be provided with two rows of gate lines 13, depending on the specific situation.

Figure 6:
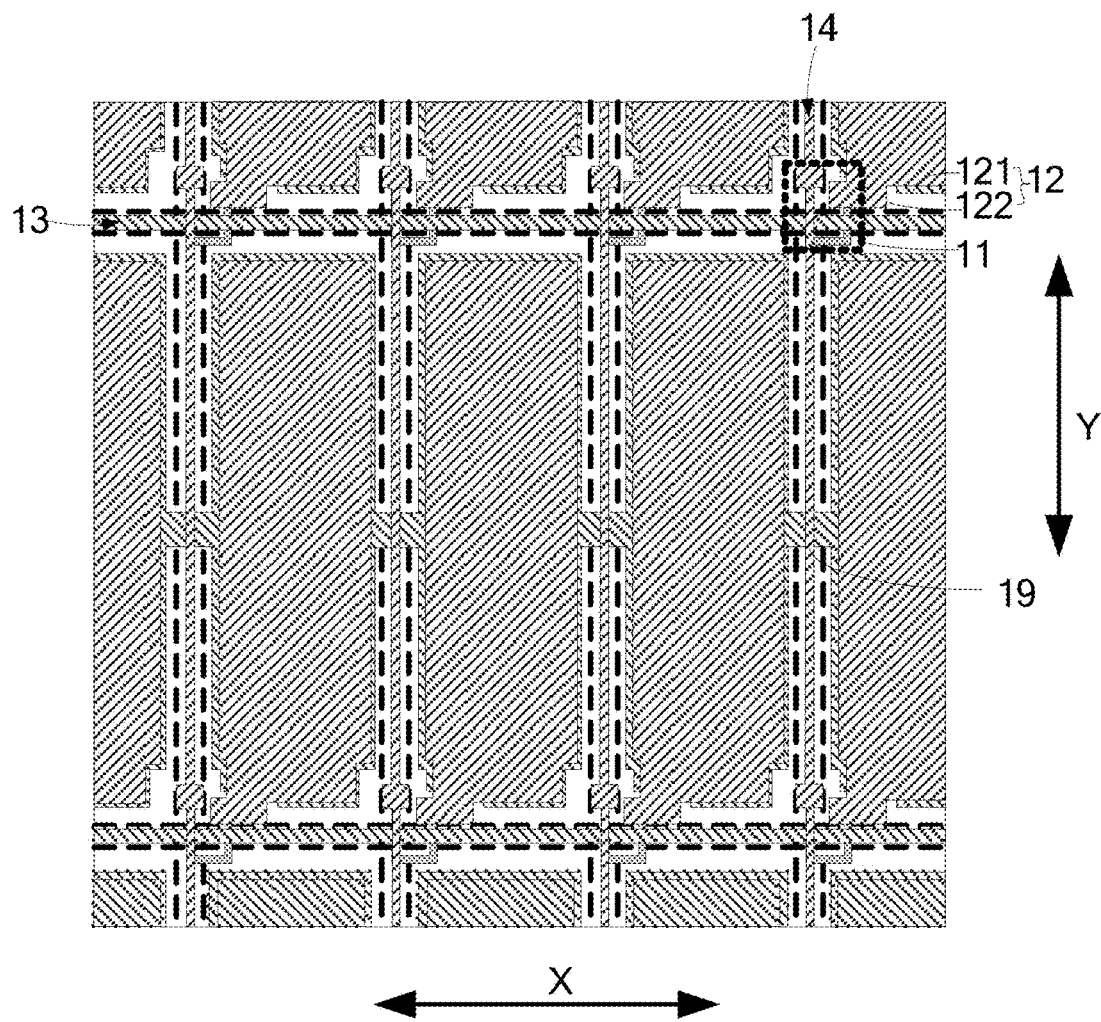
FIG. 6 shows a schematic structural view of forming a data line and a second electrode plate on the first substrate shown in FIG. 5.

The data lines 14 extend in the column direction Y and are located in the second wiring region 103. For example, as shown in FIG. 6, each column of the second wiring region 103 may be provided with a column of data lines 14, but not limited thereto. The second wiring region 103 located between two adjacent columns of sub-pixel regions 101 may also be provided with two columns of data lines 14, depending on the specific situation.

At least part of the sub-pixel circuits is located in the sub-pixel region 101. For example, the number of sub-pixel circuits may be equal to the number of the sub-pixel regions 101, wherein at least part of each sub-pixel circuit is located in respective one sub-pixel region 101.

When one row of gate line 13 is provided in each row of the first wiring region 102 and one column of data line 14 is provided in each column of the second wiring region 103, each row of gate line 13 may be electrically connected to the same row of sub-pixel circuits, and each column of data line 14 may be electrically connected to the same column of sub-pixel circuits.

In some embodiments of the disclosure, as shown in FIG. 6, orthographic projections of each column of data line 14 and each row of gate line 13 on the first substrate 10 may be similar to a straight line. But it is not limited thereto, and can also be other shapes depend on the specific situation.

For example, the material of the gate line 13 may be metals or alloys such as copper (Cu), silver (Ag), aluminum (Al), molybdenum (Mo), chromium (Cr), titanium (Ti), but is not limited thereto. The material of the data line 14 may be a composite material, that is, the data line 14 may be formed in a composite structure. For example, the data line 14 may include three layers of titanium (Ti), aluminum (Al), and titanium (Ti) stacked in sequence. Because aluminum is easy to be oxidized, the aluminum layer is sandwiched between two titanium layers, so as to effectively prevent the aluminum layer from being oxidized, thereby ensuring the performance of the data line 14. But it is not limited thereto, beside the Ti/Al/Ti sandwich structure, and the data line 14 may also be formed in a single-layer structure by adopting materials with good conductivity, depending on the specific situation.

It should be understood that the data line 14 and the gate line 13 in some embodiments of the disclosure are located on different layers. Specifically, the data line 14 may be located on one side of the gate line 13 away from the first substrate 10. In other words, when the array substrate is manufactured, the gate line 13 may be formed first, and then the data line 14 may be formed. In some embodiments, in order to avoid direct contact between the data line 14 and the gate line 13, referring to FIG. 19 and FIG. 21, an interlayer dielectric layer 16 is sandwiched between the data line 14 and the gate line 13. For example, the interlayer dielectric layer 16 may be an inorganic insulating layer, including silicon oxide, silicon nitride, silicon oxynitride, and the like.

It should be noted that the interlayer dielectric layer 16 may be provided on the entire surface of the array substrate. In other words, an orthographic projection of the interlayer dielectric layer 16 on the first substrate 10 covers not only an orthographic projection of the gate lines 13 on the first substrate 10, but also that of other structures on the first substrate 10, such as the active layer 110 and the first electrode plate 121 mentioned later. In addition, it should be noted that the interlayer dielectric layer 16 may be not only located in the display area, but also in the non-display area, as shown in FIG. 21 and FIG. 22.

The sub-pixel circuit may include a storage capacitor 12 and a transistor 11. In some embodiments, the storage capacitor 12 is located in the sub-pixel region 101, referring to FIG. 3 to FIG. 7 and FIG. 21, the storage capacitor 12 includes a first electrode plate 121 and a second electrode plate 122 opposite to each other in the thickness direction Z of the first substrate 10. For example, as shown in FIG. 3, the first electrode plate 121 and the gate lines 13 are arranged in the same layer and disconnected from each other, the second electrode plate 122 and the data lines 14 are arranged in the same layer and disconnected from each other, thereby reducing the processing steps, cost, and thickness of the array substrate while ensuring the performance requirements.

It should be noted that the first electrode plate 121 of the storage capacitor 12 may be applied with a reference voltage. As shown in FIG. 3, the first electrode plates 121 of the storage capacitors 12 corresponding to any two adjacent sub-pixel circuits in the same row of sub-pixel circuits are connected by a common line 19, and the common line 19 is provided in the same layer as the first electrode plate 121.

It should be understood that in the disclosure, "same layer" refers to a layer structure formed by using the same film preparing process to provide a film layer for forming a specific pattern, and then using the same mask through one patterning process, that is, one patterning process corresponds to one mask (also known as photomask). Depending on the specific pattern, the one patterning process may include multiple times of exposure, development or etching, the specific patterns in the formed layer structure may be continuous or discontinuous, and the specific pattern may also be at different heights or have different thicknesses. In this way, the production process is simplified, the production cost is saved, and the production efficiency is improved.

As shown in FIG. 2 to FIG. 7, the transistor 11 may include an active layer 110, a gate 111, a source 112, and a drain 113. For example, the transistor 11 may be formed in a top gate type, that is, the active layer 110 is located on one side of the gate line 13 close to the first substrate 10. In other words, when fabricating the array substrate, the active layer 110 may be fabricated first, and then the gate line 13 may be fabricated. But it is not limited thereto, the transistor 11 may also be formed in a bottom gate type, that is, when the array substrate is fabricated, the gate lines 13 may be fabricated first, and then the active layer 110 may be fabricated.

It should be noted that, as shown in FIG. 21, when the transistor 11 is of the top gate type, a gate insulating layer 15 is sandwiched between the active layer 110 and the gate 111. For example, the gate insulating layer 15 may be an inorganic insulating layer, including silicon oxide, silicon nitride, silicon oxynitride, and the like. The gate insulating layer 15 is provided on an entire surface in the array substrate. The gate insulating layer 15 is located on one side of the interlayer dielectric layer 16 close to the first substrate 10, and an orthographic projection of the gate insulating layer 15 on the first substrate 10 may cover an orthographic projection of the active layer 110 on the first substrate 10. In addition, it should be noted that the gate insulating layer 15 is not only located in the display area, but may also be located in the non-display area.

In some embodiments of the disclosure, the active layer 110 may be low-temperature polysilicon (abbreviated as: LTPS), but is not limited thereto. It may also be amorphous silicon (abbreviated as: a-Si), indium gallium zinc oxide (abbreviated as: IGZO) and the like, depending on the specific situation. It should be noted that the disclosure is described by mainly taking an example in which the active layer 110 is low-temperature polysilicon.

Figure 2:
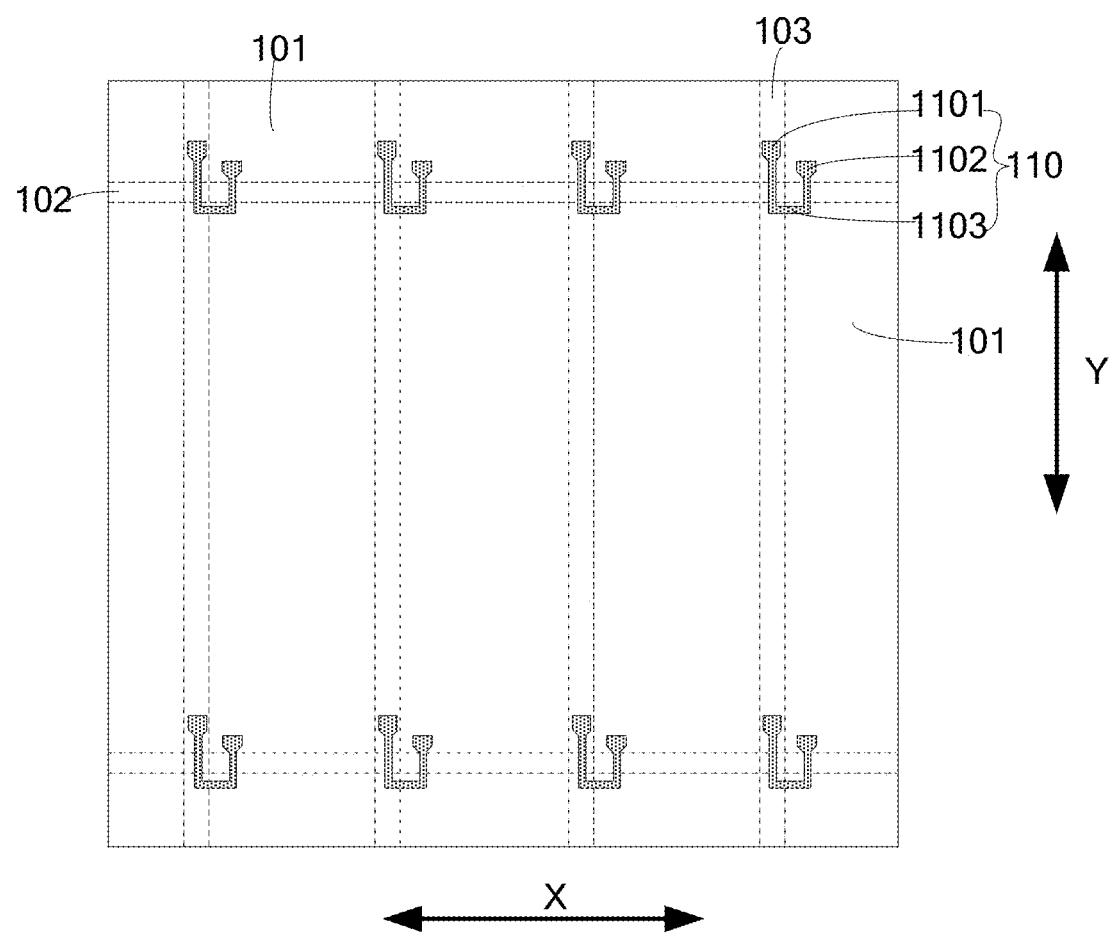
FIG. 2 shows a schematic structural diagram of forming an active layer on the first substrate shown in FIG. 1.

In some embodiments, as shown in FIG. 2, the orthographic projection of the active layer 110 on the first substrate 10 may be similar to a U shape. Specifically, the active layer 110 may include a first active portion 1101 located in the second wiring region 103, a second active portion 1102 opposite to the first active portion 1101 in the row direction X, and a third active portion 1103 at least located in the sub-pixel region 101.

It should be noted that the first active portion 1101 and the second active portion 1102 respectively extend in the column direction Y, and the third active layer 110 extends in the row direction X. The first active portion 1101, the second active portion 1102, and the third active portion 1103 each has a first end and a second end opposite to each other in the extending direction thereof.

As shown in FIG. 3, an orthographic projection of the first active portion 1101 on the first substrate 10 at least partially overlaps an orthographic projection of the gate line 13 on the first substrate 10, and the first end of the first active portion 1101 is located at one side of the gate line 13 away from the third active portion 1103, and the second end of the first active portion 1101 is connected to the first end of the third active portion 1103. The first end and the second end of the second active portion 1102 are respectively located on two adjacent sub-pixel regions 101 in the row direction X, that is, an orthographic projection of the second active portion 1102 on the first substrate 10 at least partially overlaps the orthographic projection of the gate line 13 on the first substrate 10. The transistor 11 may be a double-gate type to ensure the performance thereof. The first end of the second active portion 1102 is located at one side of the gate line 13 away from the third active portion 1103, and the second end of the second active portion 1102 is connected to the second end of the third active portion 1103.

Figure 4:
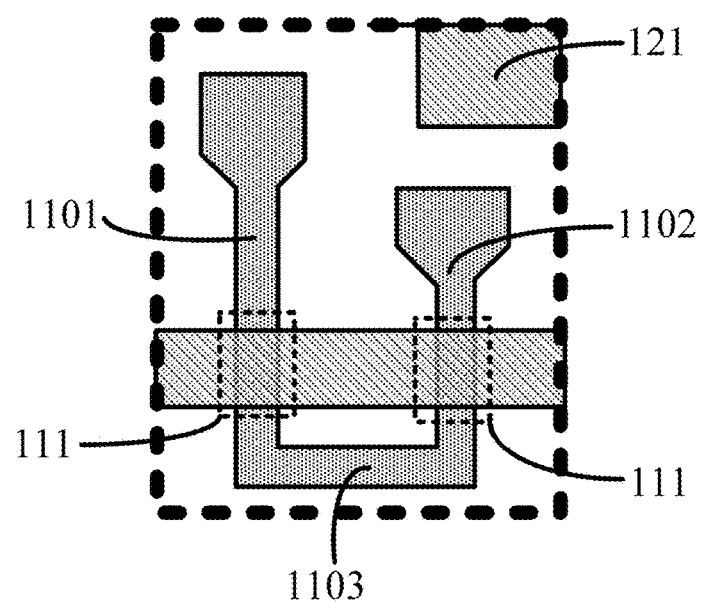
FIG. 4 shows a schematic diagram of an enlarged structure of part A shown in FIG. 3.
Figure 7:
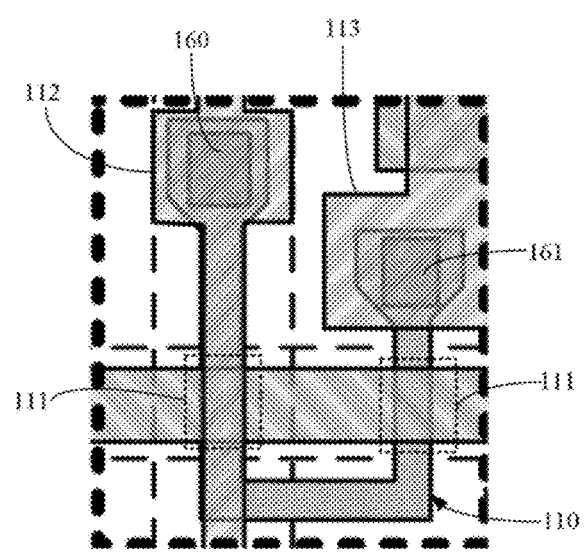
FIG. 7 shows a schematic diagram of an enlarged structure of the transistor shown in FIG. 6.

In some embodiments of the disclosure, referring to FIG. 3 and FIG. 4, the gate 111 of the transistor 11 is formed by a part of the gate line 13 that overlaps with the first active portion 1101 and the second active portion 1102 in the thickness direction Z of the first substrate 10. Referring to FIG. 6 and FIG. 7, the source 112 of the transistor 11 is formed by a part of the data line 14 that overlaps with the first end of the first active portion 1101 in the thickness direction Z of the first substrate 10, and the source 112 is connected to the first end of the first active portion 1101 through the second via hole 160. The drain 113 of the transistor 11 is formed by a part of the second electrode plate 122 that overlaps with the first end of the second active portion 1102 in the thickness direction Z of the first substrate 10, and the drain 113 is connected to the first end of the second active portion 1102 through the third via hole 161.

It should be understood that the second via hole 160 and the third via hole 161 mentioned in the disclosure may penetrate the interlayer dielectric layer 16 and the gate insulating layer 15, and respectively expose the first end of the first active portion 1101 and the first end of the second active portion 1102.

For example, the transistor 11 in some embodiments of the disclosure may be N-type, but is not limited thereto. The transistor 11 may also be P-type, depending on the specific situation.

Referring to FIG. 2 to FIG. 4, in some embodiments of the disclosure, the first end of the first active portion 1101 may be farther away from the gate line 13 than the first end of the second active portion 1102. In other words, the size of the first active portion 1102 in the column direction Y may be greater than the size of the second active portion 1102 in the column direction Y, but is not limited thereto. The size of the first active portion 1101 in the column direction Y may also be equal to or smaller than the size of the second active portion 1102 in the column direction Y, depending on the specific condition.

In some embodiments of the disclosure, the switching transistor 11 may be extended by the gate line 13 from the GOA to control the entire row of the sub-pixel circuits, and combines with the data line 14 to jointly complete the charging and discharging of the pixel. It should be noted that the GOA may be integrated on the array substrate. The GOA may be understood as a circuit structure in the non-display area of the array substrate, and the pixel circuit layer may be understood as a circuit structure in the display area of the array substrate.

In some embodiments, the GOA may include a transistor TFT as shown in FIG. 22. The transistor structure of the GOA may be different from the structure of the transistor 11 of the sub-pixel circuit, but is not limited thereto. The structure of the transistor 11 of the sub-pixel circuit may also be the same as the transistor structure of the GOA, depending on the specific situation. In addition, the GOA capacitor may also include a storage capacitor and the like.

Figure 8:
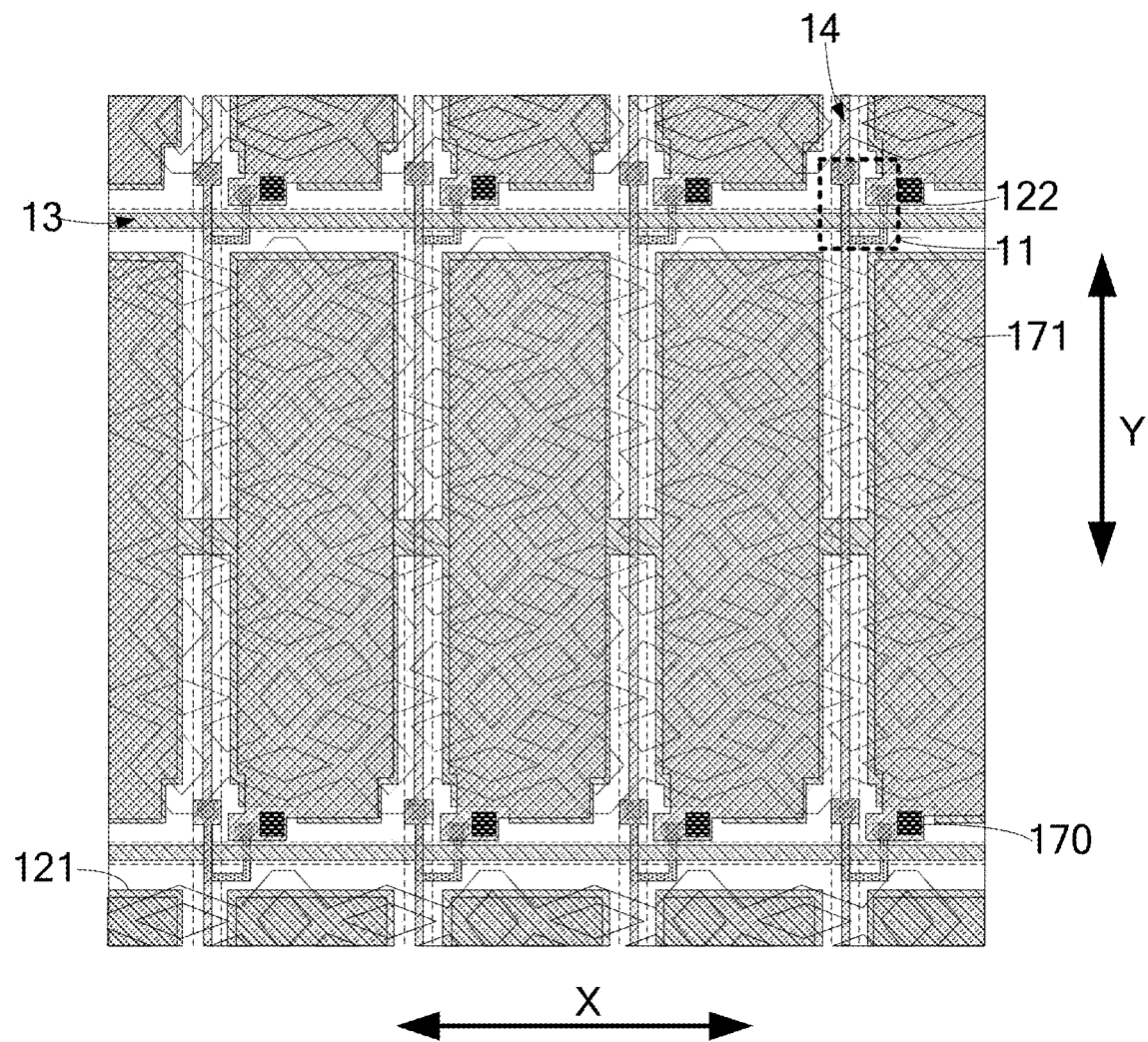
FIG. 8 shows a schematic structural diagram of forming a planarization layer on the first substrate shown in FIG. 6.
Figure 9:
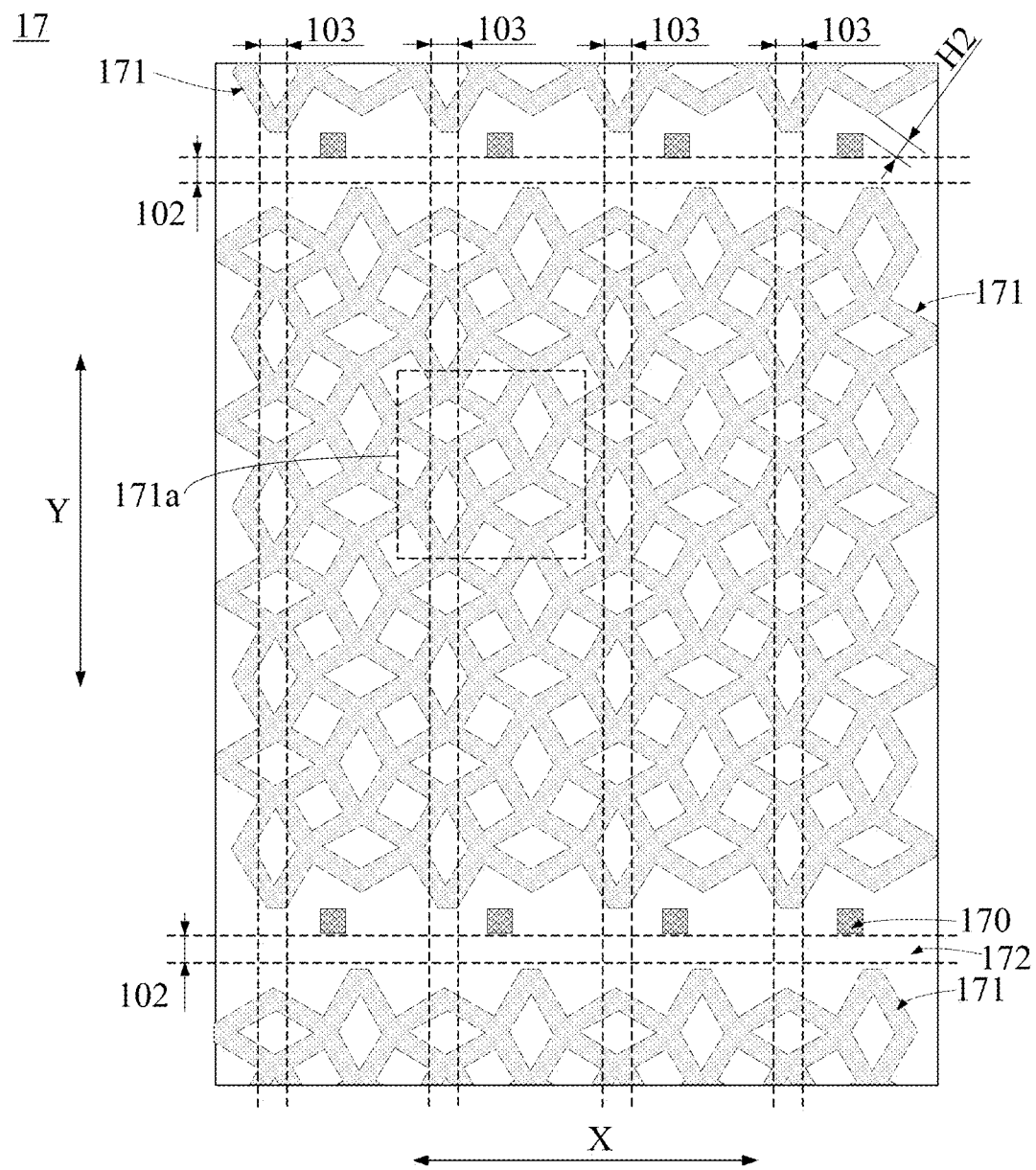
FIG. 9 shows a schematic structural diagram of a planarization layer according to an embodiment of the disclosure.
Figure 10:
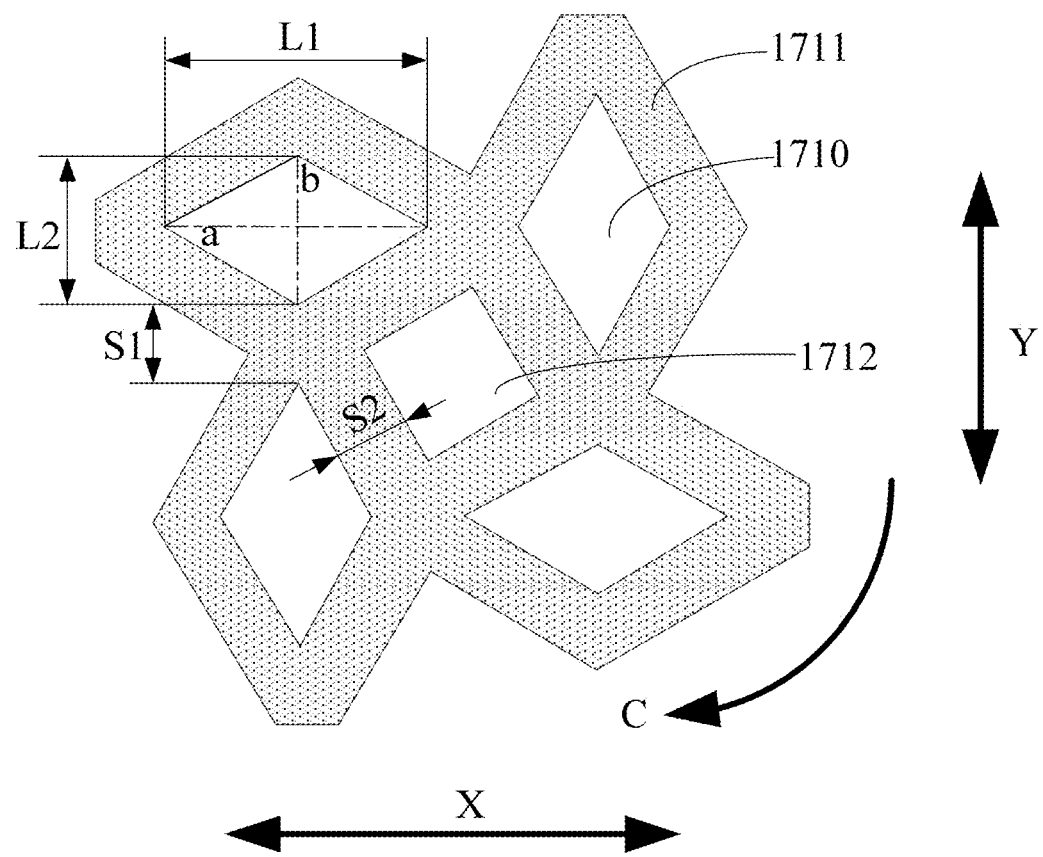
FIG. 10 shows a schematic structural diagram of the smallest repeating pattern unit of the planarization layer shown in FIG. 9.

Referring to FIG. 8 to FIG. 10, the planarization layer 17 may be formed on the pixel circuit layer, but it is not limited thereto, and may also be located on the GOA. In other words, the planarization layer 17 may be located in the display area or the non-display area. For example, the material of the planarization layer 17 may be an organic material such as optical resin, but it is not limited to this, depending on the specific situation. In addition, the planarization layer 17 may be formed in a single-layer structure, but is not limited thereto, and may also be formed in a multi-layer composite structure, depending on the specific situation.

In some embodiments of the disclosure, as shown in FIG. 8 to FIG. 9, the planarization layer 17 may be provided with a first via hole 170 located in the sub-pixel region 101, and the first via hole 170 may expose the second electrode plate 122. In other words, an orthographic projection of the first via hole 170 on the first substrate 10 may be located within an orthographic projection of the second electrode plate 122 on the first substrate 10.

It should be noted that, as shown in FIG. 8 and FIG. 9, there are a plurality of the first via holes 170 in the planarization layer 17, and the number of the first via holes 170 is equal to the number of the sub-pixel regions 101, and each first via hole 170 is correspondingly located in one sub-pixel region 101, and the relative position of each first via hole 170 in the sub-pixel region 101 may be the same. In other words, the distance in the direction X between any two adjacent first via holes 170 in the same row of first via holes 170 is equal, and the distance in the column direction Y between any two adjacent second via holes 160 in the same column of the first via holes 170 is equal, thereby reducing the design difficulty.

As shown in FIG. 8 and FIG.9, the planarization layer 17 may further include at least one pattern portion 171, which is located in the display area, and may include a plurality of pattern units 171a arranged in an array in the row direction X and the column direction Y. The pattern unit 171a is uneven and may be located at least in the sub-pixel region 101, but is not limited thereto, and may also be located in at least one of the first wiring region 102 and the second wiring region 103, depending on the specific situation.

In some embodiments of the disclosure, as shown in FIG. 10, the uneven pattern unit 171a may at least include a plurality of first bumps 1710 arranged in sequence along the circumferential direction C and a spacing groove 1711 surrounding each of the first bumps 1710. In other words, each first bump 1710 is surrounded by a spacing groove 1711. A part of the spacing groove 1711 is shared by two adjacent first bumps 1710 in the circumferential direction of the pattern unit 171a.

In addition, as shown in FIG. 9 and FIG. 10, the pattern unit 171a may further include a second bump 1712, which is located in the central area enclosed by the first bumps 1710. In some embodiments, a part of each of the spacing grooves 1711 in the pattern unit 171a close to the second bump 1712 is connected end to end in sequence along the circumferential direction C of the pattern unit 171a to surround the second bump 1712. In other words, the second bump 1712 and the first bumps 1710 are arranged with intervals.

It should be noted that the surfaces of the first bumps 1710 and the second bump 1712 away from the first substrate 10 may be curved, but are not limited thereto, and may also be flat, depending on the specific situation. In some embodiments, the maximum thickness of the first bump 1710 may be the same as the maximum thickness of the second bump 1712, thereby reducing the design difficulty, but it is not limited thereto. The maximum thickness of the first bump 1710 may also be different from the maximum thickness of the second bump 171, depending on the specific circumstances.

For example, when the first bumps 1710 are densely arranged in the pattern unit 171a, the second bump 1712 may not be provided, depending on the specific situation.

In some embodiments of the disclosure, the thickness of the first bump 1710 and the second bump 1712 refer to the distance from the bottom of the spacing groove to the top end of the first bump 1710 away from the first substrate 10, and to the top end of the second bump 1712 away from the first substrate 10, respectively. In addition, the aforementioned first bumps 1710 arranged in sequence along the circumferential direction C means that the centers of the first bumps 1710 in the pattern unit 171a are located on substantially the same circumference.

The reflective electrode layer may be formed on the planarization layer 17. In other words, in the process of manufacturing the array substrate, the planarization layer 17 may be formed first, and then the reflective electrode layer may be formed. In some embodiments, as shown in FIG. 14 to FIG. 19 and FIG. 21, the reflective electrode layer may include a plurality of reflective electrodes 18 disconnected from each other. Each reflective electrode 18 is located in one sub-pixel region 101 and electrically connected to the pixel circuit through the first via hole 170. For example, each reflective electrode 18 may be connected to the second electrode plate 122 of the storage capacitor 12 in the sub-pixel circuit through the first via hole 170. It may also be understood that each reflective electrode 18 is connected to the drain 113 of the transistor 11 in the sub-pixel circuit.

For example, the material of the reflective electrode 18 may be a composite material, that is, the reflective electrode 18 may be formed in a composite structure. For example, the reflective electrode 18 may be formed by a combination of three-layer materials including ITO (Indium Tin Oxide), Ag (Silver), and ITO (Indium Tin Oxide) stacked in sequence. Since Ag is easy to be oxidized, the Ag layer is sandwiched between two ITO layers, thereby effectively preventing the Ag layer from being oxidized, so as to ensure the performance of the reflective electrode 18, but it is not limited thereto. In addition to the ITO/Ag/ITO sandwich structure, the reflective electrode 18 may also be formed in a single-layer structure by using materials with good conductivity and reflection performance, depending on the specific situation.

Figure 15:
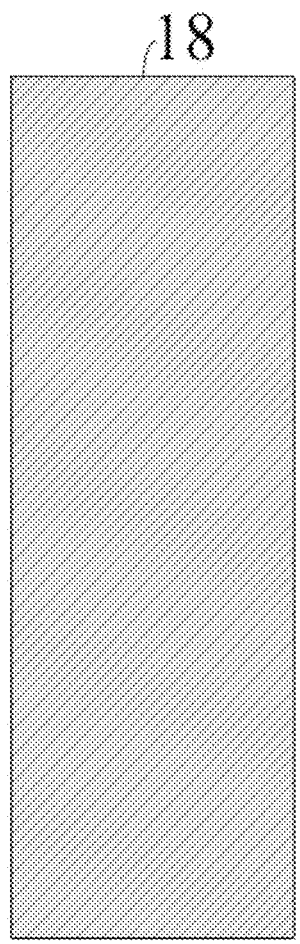
FIG. 15 shows a schematic structural diagram of the reflective electrode in the structure shown in FIG. 14.
Figure 16:
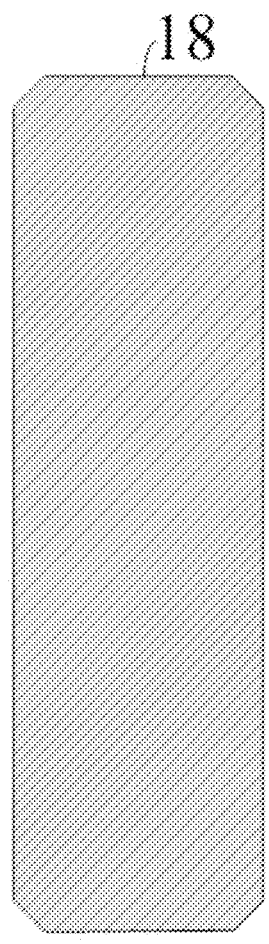
FIG. 16 shows a schematic structural diagram of a reflective electrode according to another embodiment of the disclosure.
Figure 17:
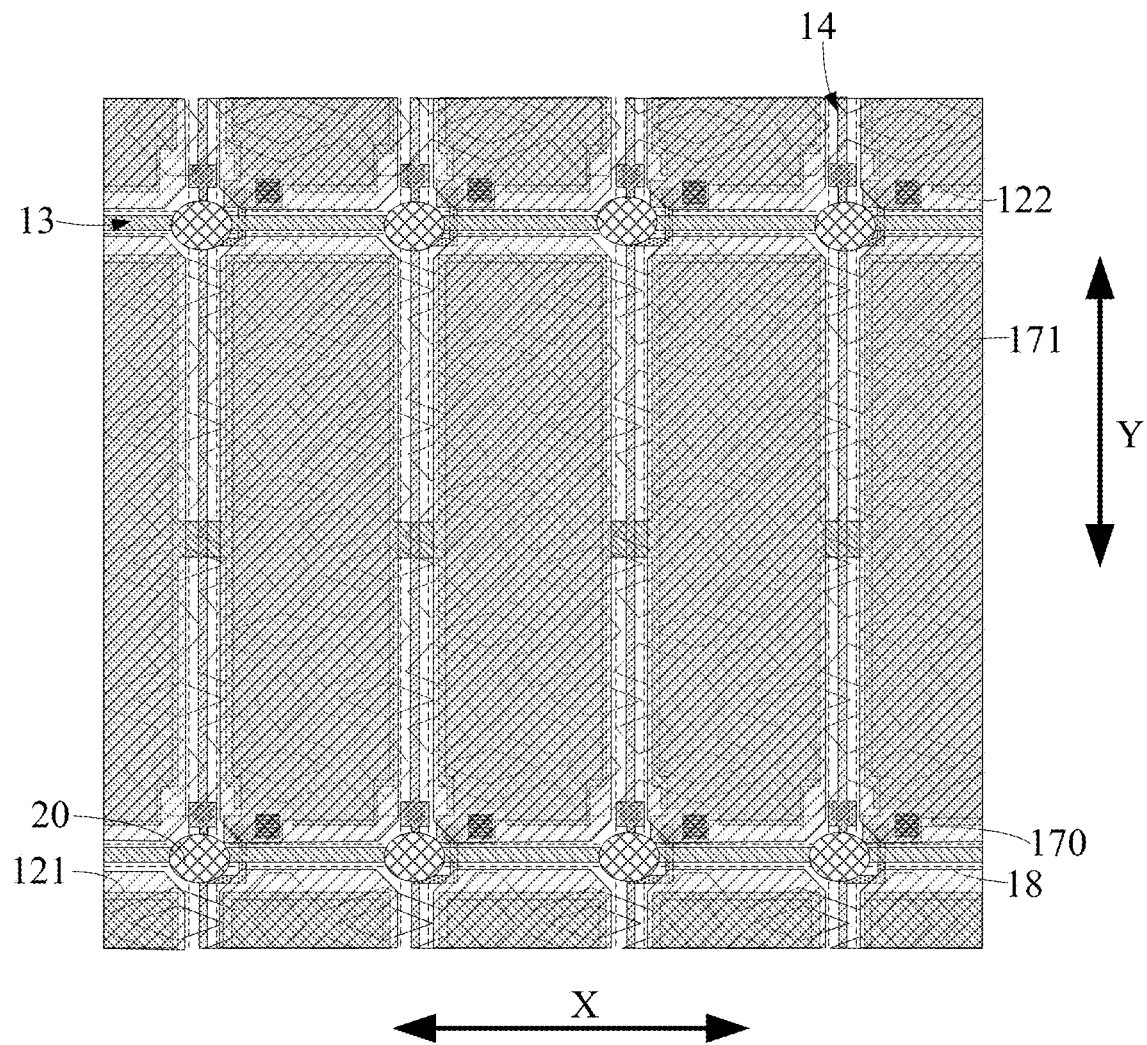
FIG. 17 shows a schematic diagram of the positional relationship between the array substrate and the spacer according to an embodiment of the disclosure.

Moreover, in some embodiments of the disclosure, an orthographic projection of the reflective electrode 18 on the first substrate 10 may be a rectangular shape as shown in FIG. 15, but is not limited thereto. It may be also in other shapes, for example, the rectangular shape with cut corners, depending on the specific situation.

It should be noted that since the planarization layer 17 has the pattern unit 171a with unevenness, when the reflective electrode layer is subsequently fabricated, as shown in FIG. 21, the part of the reflective electrode 18 corresponding to the pattern unit 171a is formed in the uneven shape matching with the pattern unit 171a. Compared with the scheme of adding a heat dissipation film, the above scheme can improve the viewing angle and maintain uniformity in all directions, and can also reduce the cost.

The structure of the planarization layer 17 in some embodiments of the disclosure may be described in detail below in conjunction with specific drawings.

In some embodiments of the disclosure, as shown in FIG. 9, each pattern unit 171a of the pattern portion 171 in the planarization layer 17 may be continuously arranged. In some embodiments, the pattern portion 171 as a whole may extend in the row direction X, as shown in FIG. 8, the orthographic projection of the pattern portion 171 on the first substrate 10 at least partially overlaps with the sub-pixel regions 101 located in the same row. It should be understood that, since a part of the second wiring region 103 is located between adjacent sub-pixel regions 101 in the row direction X, when the orthographic projection of the pattern portion 171 on the first substrate 10 in some embodiments of the disclosure overlaps with the sub-pixel regions 101 in the same row, it can also partially overlap with the second wiring region 103 located between the adjacent sub-pixel regions 101.

It should be noted that, in some embodiments of the disclosure, the planarization layer 17 located in the display area may further include a non-patterned portion 172 in addition to the aforementioned first via hole 170 and the pattern portion 171. As shown in FIG. 9, the non-patterned portion 172 may be located at least in the first wiring region 102 of the first substrate 10. The non-patterned portion 172 may extend in the row direction X as a whole. It should be understood that the main part of the non-patterned portion 172 is located in the first wiring region 102, and remaining small part thereof may be located in the sub-pixel region 101 and the second wiring region 103.

In some embodiments, the non-patterned portion 172 mentioned in some embodiments of the disclosure refers to a portion where no through holes and grooves are provided, that is, as shown in FIG. 21, the entire surface of the non-patterned portion 172 away from the first substrate 10 is flat. It should be understood that the surface of the non-patterned portion 172 away from the first substrate 10 may be in the same plane as the top end of the first bump 1710 or the second bump 1712 away from the first substrate 10, but is not limited thereto. The top end of the first bump 1710 or the second bump 1712 away from the first substrate 10 may also be closer to the first substrate 10 than the surface of the non-patterned portion 172 away from the first substrate 10, depending on the actual situation.

In some embodiments of the disclosure, as shown in FIG. 9, the pattern portion 171 and the non-patterned portion 172 of the planarization layer 17 may be provided in multiples. Specifically, the number of the pattern portions 171 may be the same as the number of rows of the sub-pixel regions 101, with each pattern portion 171 corresponding to a row of sub-pixel regions 101. The number of non-patterned portions 172 may be equal to the number of first wiring regions 102, with each non-patterned portion 172 corresponding to a row of first wiring regions 102. In other words, the pattern portions 171 and the non-patterned portions 172 in some embodiments of the disclosure may be arranged in an alternative arrangement in the column direction Y It should be noted that the pattern unit 171a in the pattern portion 171 that is in contact with the non-patterned portion 172 may be the entire pattern unit 171a or a part of the pattern unit 171a.

In some embodiments of the disclosure, the planarization layer 17 is not only located on the pixel circuit layer in the display area, but also on the GOA in the non-display area. As shown in FIG. 22, the entire surface of the planarization layer 17 located in the non-display area and away from the first substrate 10 may be flat, that is, the portion of the planarization layer 17 located in the non-display area may also be a non-patterned portion.

In some embodiments of the disclosure, the orthographic projection of the first bump 1710 in the pattern unit 171a on the first substrate 10 may be a symmetrical pattern to reduce the design difficulty, but it is not limited thereto. The orthographic projection of the first bump 1710 on the first substrate 10 may also be an asymmetrical pattern, depending on the specific situation.

Optionally, when the orthographic projection of the first bumps 1710 on the first substrate 10 is a symmetrical pattern, the symmetrical pattern may include at least two symmetry axes, as shown in FIG. 10, including a first symmetry axis a and a second symmetry axis b perpendicular to each other, wherein the length of the first symmetry axis a may be greater than the length of the second symmetry axis b. It should be noted that the first symmetry axis a and the second symmetry axis b mentioned in the disclosure are both perpendicular to the thickness direction Z of the array substrate.

Further, in the circumferential direction C of the pattern unit 171a, the extension directions of the first symmetry axis a corresponding to two adjacent symmetric patterns intersect. This scheme enables the array substrate to achieve diffuse reflection while also effectively alleviating the macro Mura (uneven brightness) or streaks. Furthermore, in the axial direction of the pattern unit 171a, the extension directions of the first symmetry axis a corresponding to two adjacent symmetric patterns are perpendicular to each other, so as to reduce the design difficulty.

For example, as shown in FIG. 10, the pattern unit 171a in some embodiments of the disclosure may include four first bumps 1710. In the circumferential direction C of the pattern unit 171a, taking two symmetrical patterns of two adjacent first bumps 1710 as an example, the first symmetry axis a of one may be collinear with the second symmetry axis b of the other to further reduce the design difficulty of the pattern unit 171a. Specifically, as shown in FIG. 10, in the circumferential direction C of the pattern unit 171a, further taking two symmetrical patterns of two adjacent first bumps 1710 as the example, the first symmetry axis a of one extends in the row direction X, and the first symmetry axis a of the other extends in the column direction Y to further reduce the design difficulty, but it is not limited thereto. The first symmetry axis a can also extend in another direction intersecting the row direction X and the column direction Y, depending on the specific situation.

It should be understood that the number of the first bumps 1710 in the pattern unit 171a is not limited to the aforementioned four, and may also be six, eight, and so on.

In some embodiments of the disclosure, the symmetry axis of the symmetry pattern of the first bump 1710 may include only two, that is, the aforementioned first symmetry axis a and the second symmetry axis b.

Figure 11:
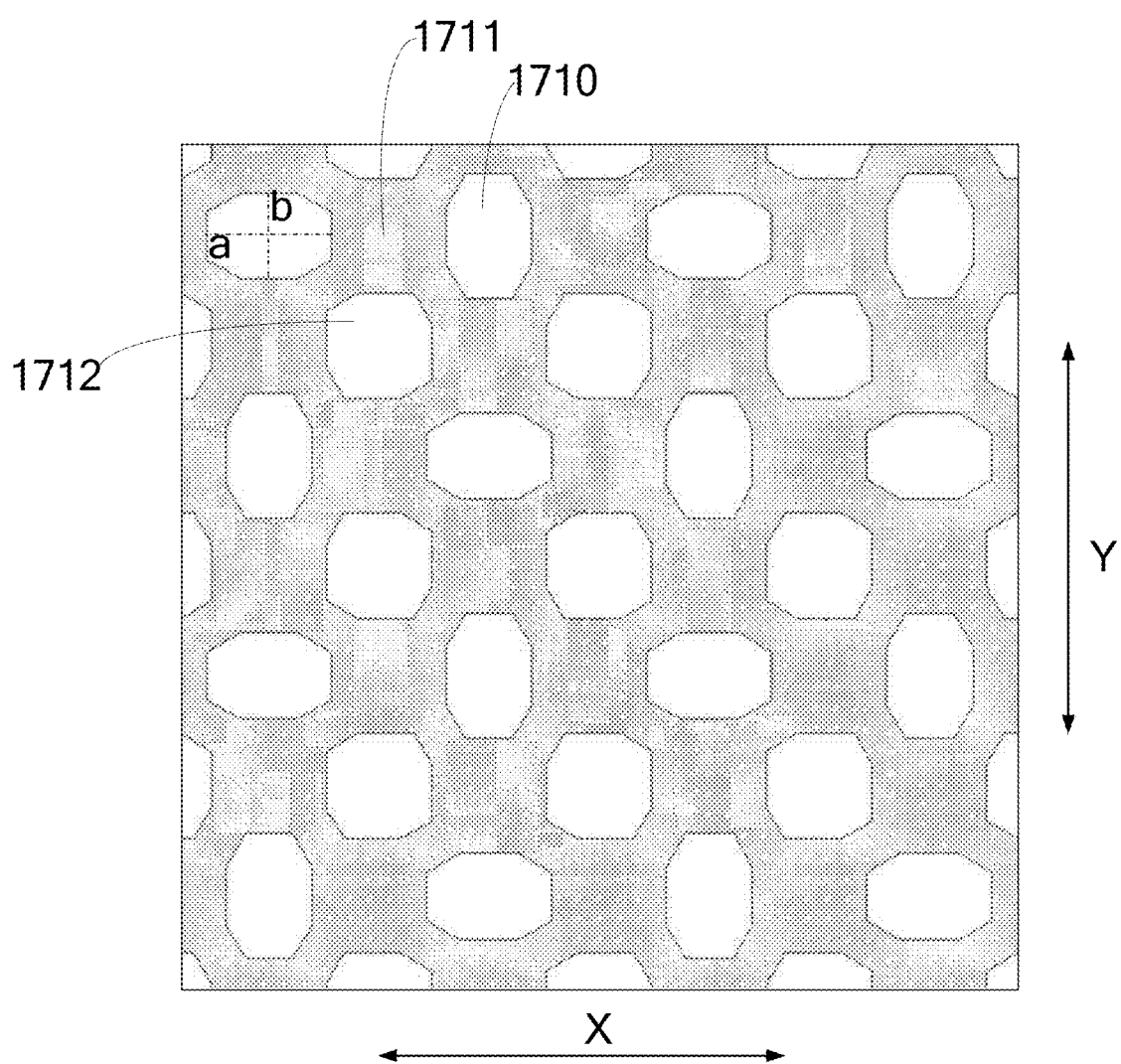
FIG. 11 shows a schematic structural diagram of the pattern portion in the planarization layer according to another embodiment of the disclosure.
Figure 12:
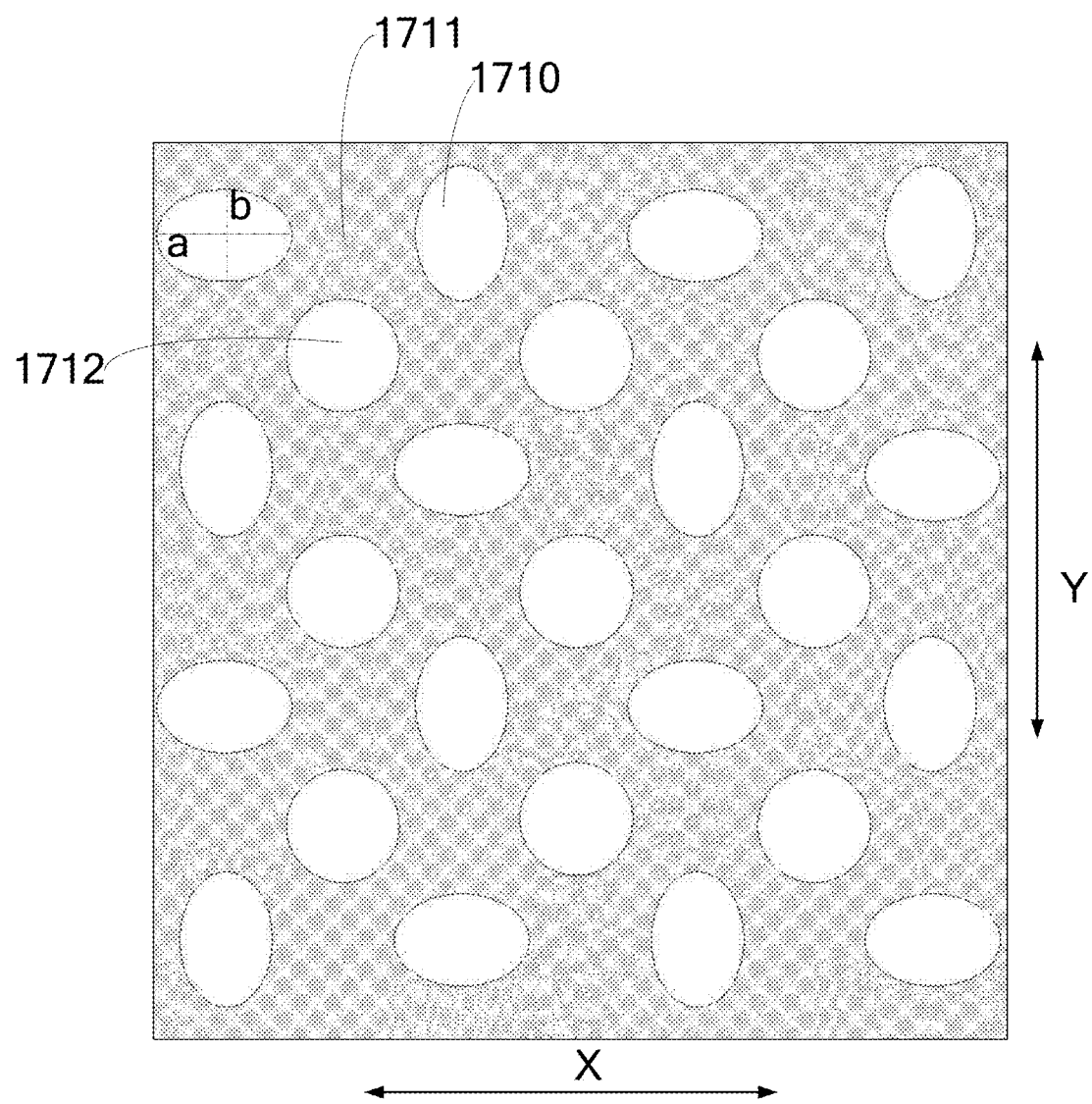
FIG. 12 shows a schematic structural diagram of the pattern portion in the planarization layer according to yet another embodiment of the disclosure.

For example, the symmetrical pattern as a whole may be or approximate to a rhombus as shown in FIG. 9, an octagon as shown in FIG. 11, or an ellipse as shown in FIG. 12. But it is not limited thereto and may also be in other shapes including an rectangular.

In some embodiments, as shown in FIG. 10, when the symmetrical pattern of the first bump 1710 is a rhombus, the outer contour of the orthographic projection of the spacing groove 1711 surrounding the periphery of the first bump 1710 on the first substrate 10 may also be similar to a rhombus, and the orthographic projection of the second bump 1712 at the center of the pattern unit 171a on the first substrate 10 may be a parallelogram. As shown in FIG. 11, when the symmetrical pattern of the first bump 1710 is an octagon, the outer contour of the orthographic projection of the spacing groove 1711 surrounding the periphery of the first bump 1710 on the first substrate 10 may also be similar to an octagon, and the orthographic projection of the second bump 1712 at the center of the pattern unit 171a on the first substrate 10 may be octagonal. As shown in FIG. 12, when the symmetrical pattern of the first bump 1710 is elliptical, the orthographic projection of the second bump 1712 at the center of the pattern unit 171a on the first substrate 10 may be circular or elliptical, and the shape of the orthographic projection of the spacing groove 1711 surrounding the periphery of the first bump 1710 on the first substrate 10 may be based on the shape of the first bump 1710, the second bump 1712 and the arrangement thereof.

In some embodiments of the disclosure, as shown in FIG. 10, the ratio of the length L1 of the first symmetry axis a of the symmetrical pattern of the first bump 1710 to the length L2 of the second symmetry axis b of the first bump 1710 may be 1.5 to 2.5, such as 1.5, 2, 2.5, and the like. This scheme can reduce the design difficulty while improving the diffuse reflection of the product.

For example, the length L2 of the second symmetry axis b may be 6 μm to 10 μm, such as 6 μm, 7 μm, 8 μm, 9 μm, 10 μm, etc., and the length L1 of the first symmetry axis a may be 9 μm to 25 μm, such as 9 μm, 13 μm, 17 μm, 25 μm, etc., so as to improve the diffuse reflection of the product, as well as reduce the design difficulty. But it is not limited thereto, the first symmetry axis a and the second symmetry axis b may also be within the range of other values, depending on the specific situation.

In some embodiments of the disclosure, as shown in FIG. 10, the minimum distance between two adjacent first bumps 1710 in the circumferential direction C of the pattern unit 171a is the first distance S1, and the minimum distance between the second bump 1712 and the first bump 1710 in the pattern unit 171a is the second distance S2. In some embodiments, the ratio between the first distance S1 and the second distance S2 may be 1 to 1.5, such as: 1, 1.1, 1.2, 1.3, 1.4, 1.5, etc., this scheme can reduce the design difficulty while improving the diffuse reflection of the product.

For example, the second distance S2 may be 1.5 μm to 5 μm, such as: 1.5 μm, 2 μm, 2.5 μm, 3 μm, 3.5 μm, 4 μm, 4.5 μm, 5 μm, etc.; and the first distance S1 may be 1.5 μm to 7 μm, such as: 1.5 μm, 2.5 μm, 3.5 μm, 4.5 μm, 5.5 μm, 6.5 μm, 7 μm, etc., so as to improve the diffuse reflection of the product, as well as reduce the design difficulty. But it is not limited thereto, the first distance S1 and the second distance S2 may also be in other value ranges, depending on the specific situation.

When the array substrate is applied to a 10.5-inch RLCD XGA product, it should be noted that the LCD screen with a resolution of 1024*768 is called XGA. As shown in FIG. 10, the symmetrical pattern of the first bump 1710 in some embodiments of the disclosure may be a rhombus, the length L1 of the first symmetry axis a of the rhombic symmetrical pattern may be approximately equal to 15.7 μm, and the length L2 of the second symmetry axis b may be approximately equal to 9 μm. In other words, the ratio of the length L1 of the first symmetry axis a to the length L2 of the second symmetry axis b is approximately 1.74. The aforementioned first distance S1 may be approximately equal to 5.4 μm, and the second distance S2 may be approximately equal to 4 μm. In other words, the ratio of the first distance S1 to the second distance S2 is about 1.35.

Figure 13:
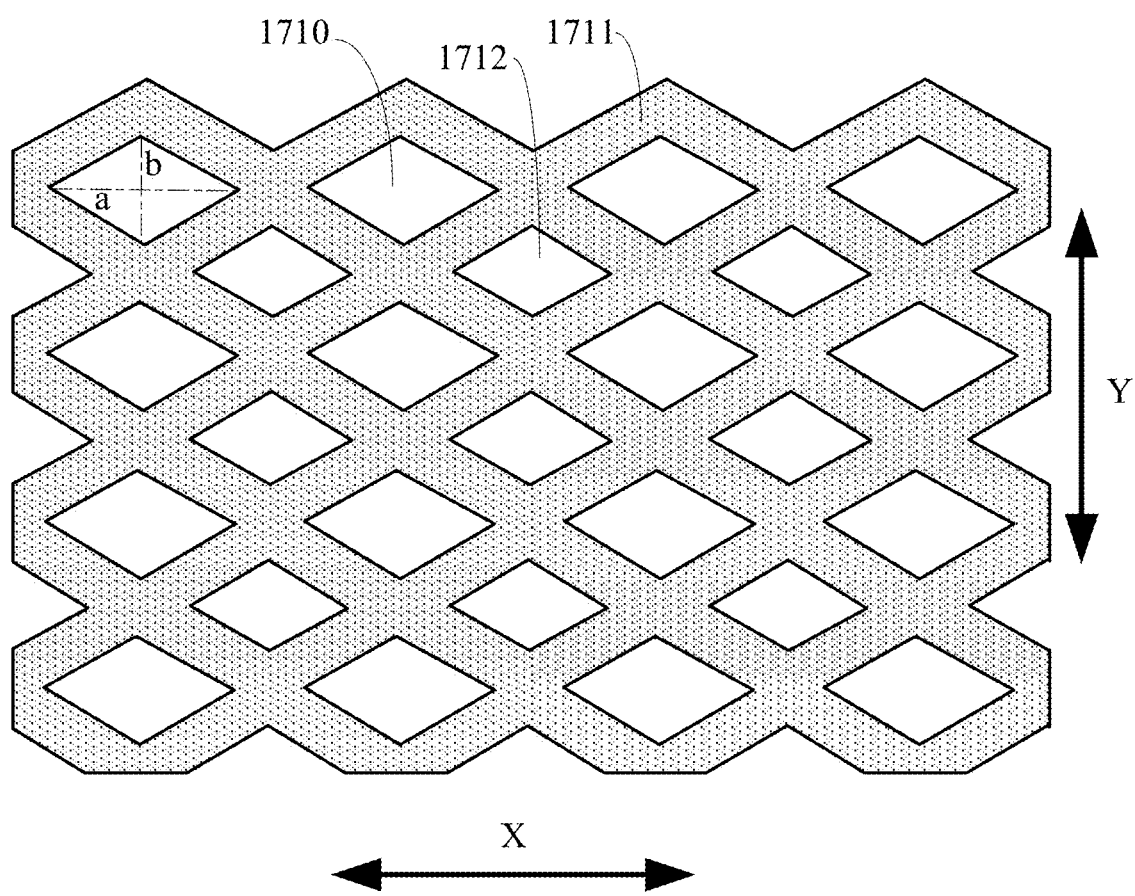
FIG. 13 shows a schematic structural diagram of the pattern portion in the planarization layer described in the related art.
Figure 14:
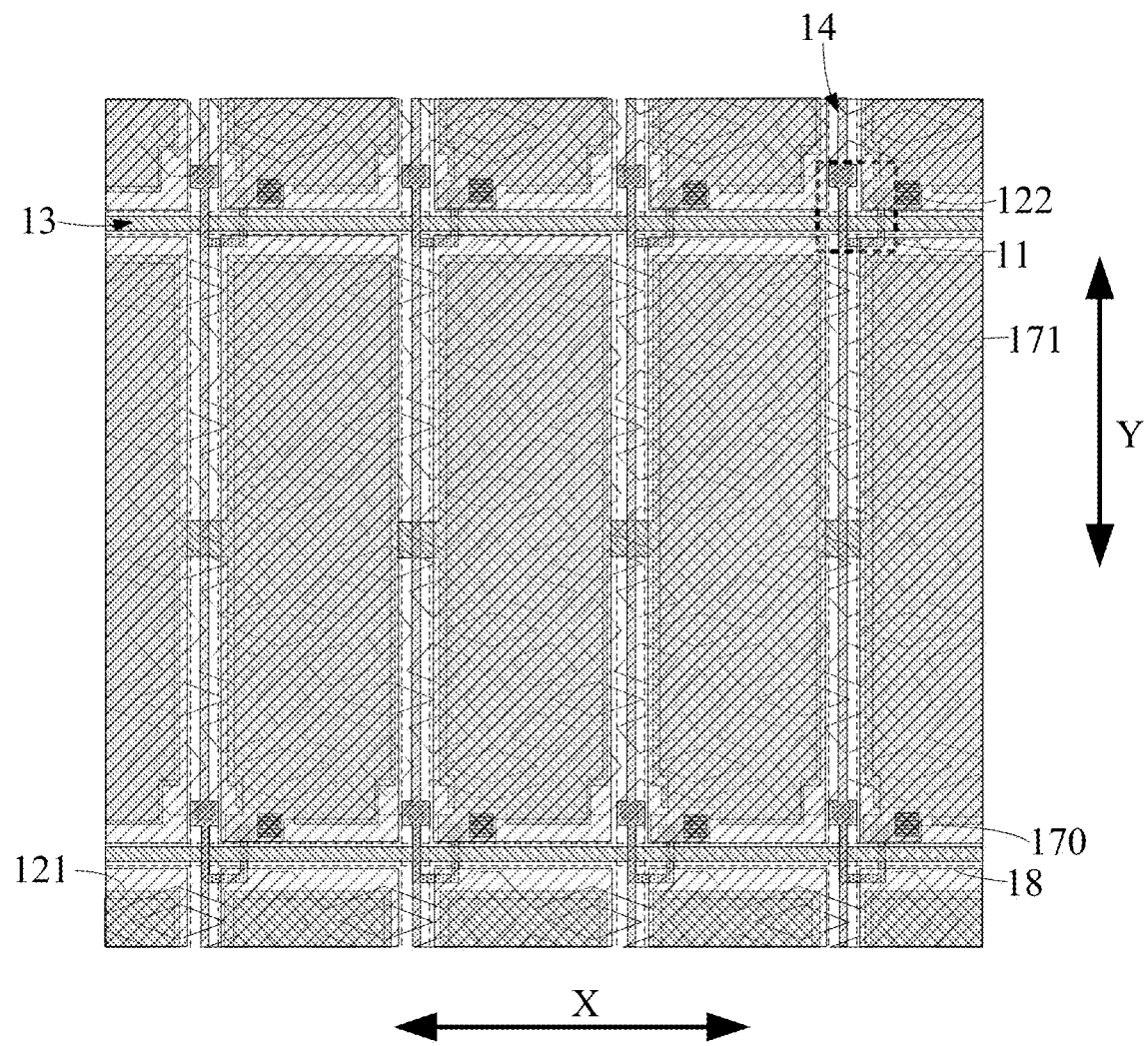
FIG. 14 shows a schematic structural view of forming a reflective electrode on the first substrate shown in FIG. 8.

In some embodiments of the disclosure, as shown in FIG. 10, the pattern unit 171a is the smallest repeating unit, and the pattern unit 171a may include four first bumps 1710 with a symmetrical pattern in a rhombus shape. In the circumferential direction C of the pattern unit 171a, one of the two adjacent first bumps 1710 is rotated by 90° compared to the other. In other words, the four first bumps 1710 in the pattern unit 171a may be arranged in a windmill shape, and a plurality of these smallest repeating units are closely packed in the row direction X and the column direction Y. As shown in FIG. 9, in the oblique direction (the direction intersecting the row direction X and the column direction Y), the first bumps 1710 and the second bumps 1712 are arranged alternatively, so that the spacing grooves 1711 on the same side of the first bumps 1710 and the second bumps 1712 are in a serpentine (i.e., non-straight) shape as a whole. Compared to the regular arrangement shown in FIG. 13 in which the first symmetry axes a of two adjacent first bumps 1710 in the row direction X are collinear, the second symmetry axes b of two adjacent first bumps 1710 in the column direction Y are collinear, and the spacing grooves 1711 on the same side of the first bumps 1710 and the second bumps 1712 are substantially in a straight line, the above-described scheme can alleviate the situation that light passes through the structure at the spacing groove 1711 to form a certain fixed phase difference, that is, alleviate the interference fringe situation.

In some embodiments of the disclosure, the pattern unit 171a includes four first bumps 1710 with a symmetrical pattern in the rhombus shape and a second bump 1712 located at the center of the pattern unit 171a, and the spacing between the bumps is a fixed size (for example, referring to the contents of the first distance S1 and the second distance S2 mentioned above). Compared with the scheme of random arrangement, it can ensure that the topography of the pattern unit 171a meets the requirements, so as to avoid the slope angle of part of the bumps from being too large to result in the low reflectivity of the reflective electrode 18.

In some embodiments, the optical design of the reflection model of the disclosure is described as follows.

According to the test requirements, some embodiments of the disclosure need to ensure that the light source is reflected at 0°. In order to achieve this goal, the slope angle y of the bumps (including the first bump 1710 and the second bump 1712) may be calculated according to the law of reflection and refraction as follows.

Figure 23:
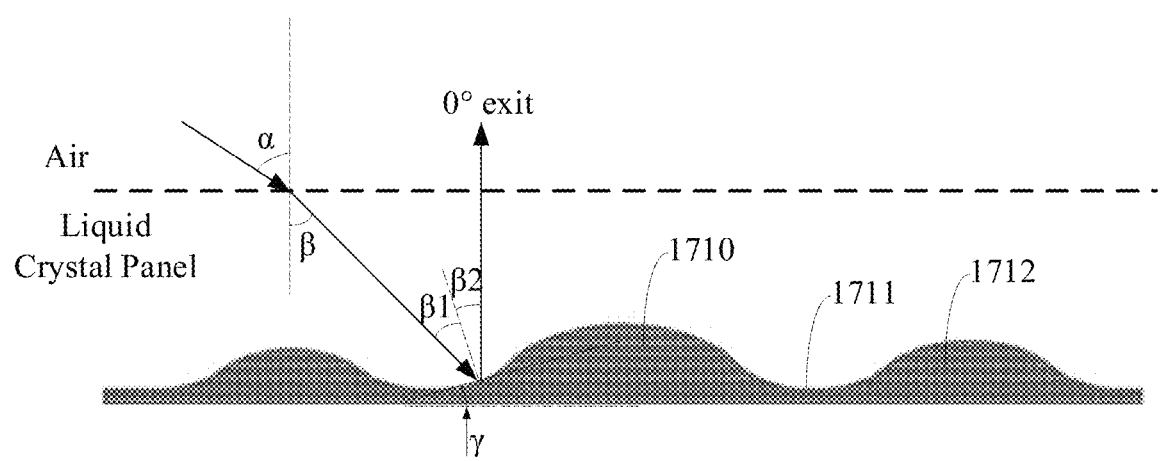
FIG. 23 shows a schematic diagram of refraction and reflection according to an embodiment of the disclosure.

Sin α÷Sin β=n1÷n2, β=arc sin (Sin α×n2÷n1), where n1 is the refractive index of the liquid crystal panel; specifically, the upper polarizer, glass substrate, color film layer and liquid crystal layer are regarded as a whole, and the overall equivalent refractive index is n1≈1.5; n2 is the refractive index of air, and n2=1.0; therefore, when a is 30°, β≈19.4. In addition, according to the law of reflection, as shown in FIG. 23, β=β1+β2, β2=β1−γ. Therefore, it may be derived that the slope angle of the first bump 1710 and the second bump 1712 is γ≈β÷2=9.7°.

Based on the foregoing description, in order to achieve the best reflectivity, the slope angle γ of the first bump 1710 and the second bump 1712 may be controlled within the range of 9.5° to 10°. Taking into account the process fluctuations, the slope angle γ of the first bump 1710 and the second bump 1712 is controlled at 6° to 13°, for example, 6°, 7°, 8°, 9°, 10°, 11°, 12°, 13°, and the like.

In some embodiments of the disclosure, as shown in FIG. 21, at the position of the spacing groove 1711, the thickness H1 of the planarization layer 17 may be greater than or equal to 1 μm, that is, the minimum distance H1 between the groove bottom of the spacing groove 1711 and one side of the second electrode plate 122 away from the first substrate 10 may be greater than or equal to 1 μm, so that the coupling capacitance between the reflective electrode 18 and the second electrode plate 122 or the data line 14 may be reduced, thereby alleviating the occurrence of flickering.

Moreover, in some embodiments of the disclosure, if the first via hole 170 of the planarization layer 17 overlaps or is relatively close to the spacing groove 1711, the actually formed first via hole 170 may be too large and a deep pit with a relatively large size may be formed on the periphery, thereby likely causing a higher risk of small black dots due to remain of PI (Polyimide alignment liquid). In order to solve this problem, and taking into account the film formation process and process fluctuations, the distance H2 between the first via hole 170 and the spacing groove 1711 on the planarization layer 17 may be designed to be greater than or equal to 5 μm, as shown in FIG. 9, so as to effectively avoid the risk of small black spots.

It should be understood that, in addition to the aforementioned film layers, the array substrate in some embodiments of the disclosure may also include an alignment film (not shown in the drawings), and the alignment film may be located on one side of the reflective electrode layer away from the first substrate 10.

In some embodiments, the manufacturing method of the array substrate described in the foregoing embodiments of the disclosure may be as follows.

The buffer layer 10b is deposited on the glass layer 10a to form the first substrate 10.

Subsequently, the active film layer may be deposited first, and then etched and cleaned after exposure with mask to form the aforementioned U-shaped active layer 110 in a specific area, as shown in FIG. 2. In the U-shaped active layer 110, the first end of the first active portion 1101 may serve as a connection end of the source 112, and the first end of the second active portion 1102 may serve as a connection end of the drain 113.

After that, the gate insulating layer 15 and the first metal layer are deposited in sequence, and then the first metal layer is etched and cleaned after exposure with mask to form, as shown in FIG. 3, the gate line 13 in form of a straight line, the first electrode plate 121 in shape of a flat plate, and the common line 19 connecting two adjacent first electrode plates 121 in the row direction X. Moreover, a specific position around the gate line 13 is doped to form an N-type thin film transistor, with a part of the gate line 13 located between the doped regions may be formed as the gate 111 of the transistor 11, as shown in FIG. 4.

Figure 5:
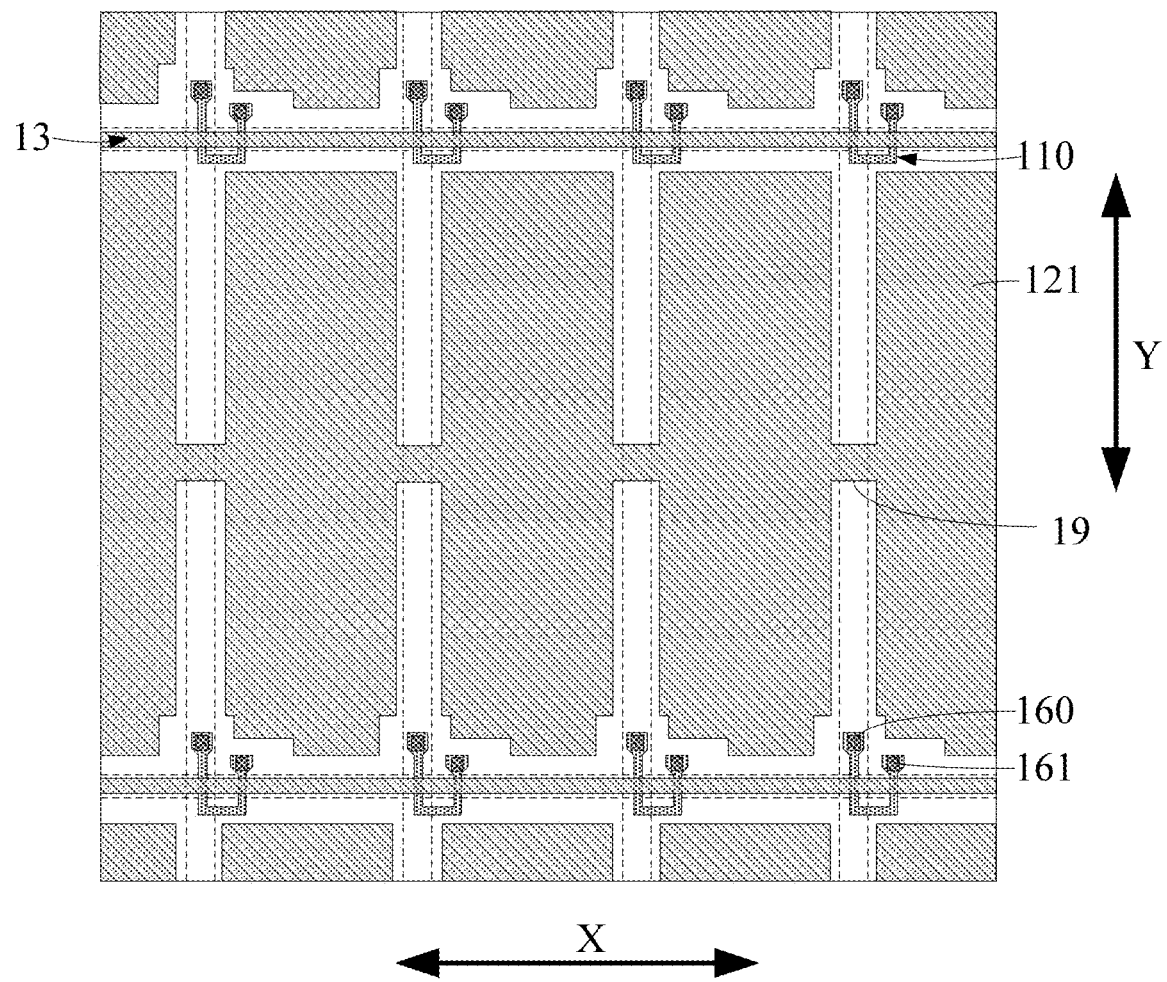
FIG. 5 shows a schematic structural view of forming a second via hole and a third via hole on the first substrate shown in FIG. 3.

After that, the interlayer dielectric layer 16 is deposited. In order to achieve subsequent connection between the metal layer and the active layer 110 at corresponding positions, it needs to be exposed and etched with mask, and the positions to be connected are subjected to via processing, that is, to form the second via hole 160 and the third via hole 161 penetrating through the interlayer dielectric layer 16 and the gate insulating layer 15. As shown in FIG. 5, the second via hole 160 exposes the first end of the first active portion 1101, and the third via hole 161 exposes the second end of the second active portion 1102.

After that, the second metal layer is deposited, and then etched and cleaned after exposure with mask to form the aforementioned data line 14 and the second electrode plate 122 as shown in FIG. 6. In some embodiments, as shown in FIG. 7, a part of the data line 14 is connected to the first end of the first active portion 1101 through the second via hole 160, and a part of the second electrode plate 122 is connected to the first end of the second active portion 1102 through the third via hole 161. Herein, the part of the data line 14 corresponding to the first end of the first active layer 110 may be defined as the source 112 of the transistor 11, and the part of the second electrode plate 122 corresponding to the second end of the second active layer 110 may be defined as the drain 113 of the transistor 11.

After that, the optical resin layer is deposited, and then etched and cleaned after exposure with mask to form the aforementioned planarization layer 17, as shown in FIG. 8 and FIG. 9. For example, the optical resin is a positive adhesive, and the mask used in the formation of the planarization layer 17 may be an HTM (semi-permeable film) mask. The HTM mask includes three regions with different transmittances, including a first region for preparing the first via hole 170, a second region for preparing the pattern portion 171, and a third region for preparing the non-patterned portion 172.

It should be understood that when the optical resin is the positive adhesive, the transmittance of the first region in the HTM mask is 100% to ensure the preparation of the first via hole 170. The transmittance of the second region in the HTM mask is less than 100% and greater than 0, for example, the transmittance of the second region may be 20%. But it is not limited thereto, it may be determined according to the specific situation, as long as the spacing groove 1711 can be effectively formed to prepare the aforementioned pattern portion 171. The transmittance of the third region in the HTM mask is 0, that is, the third region is a non-transmissive area.

After that, the third metal layer is deposited, and then etched and cleaned after exposure with Mask to form the aforementioned square-shaped reflective electrode 18, which is connected to the second electrode plate 122 through the first via hole 170, as shown in FIG. 11. In some embodiments, the reflective electrode 18 may be regarded as the pixel electrode in the product.

Some embodiments of the disclosure also provide a display panel, wherein the display panel includes the array substrate described in any one of the foregoing embodiments, which will not be repeated here. The display panel in some embodiments of the disclosure may be a liquid crystal display panel, which, in addition to the aforementioned array substrate, may also include an opposing substrate arranged in an opposing way with respect to the array substrate, and may also include liquid crystal molecule material (not shown in the drawings) between the opposing substrate and the array substrate.

In some embodiments of the disclosure, the opposing substrate includes a second substrate 22 and a spacer 20 located at one side of the second substrate 22 close to the array substrate. As shown in FIG. 17 to FIG. 22, the orthographic projection of the spacer 20 on the first substrate 10 at partially overlaps with the overlapping parts of the first wiring region 102 and the second wiring region 103, thereby ensuring the aperture ratio while avoiding the spacer 20 from sliding out of the blocked area during the stress test, so as to improve the problem of poor light leakage in the dark state.

For example, the second substrate 22 in some embodiments of the disclosure may be a glass substrate, but is not limited thereto, and may also be formed in other transparent structures. The number of spacers 20 in the opposing substrate may be multiple, and the plurality of spacers 20 may include a main spacer and an auxiliary spacer. There may be multiple main spacers and multiple auxiliary spacers, which are evenly distributed in the display panel, and the number of main spacers is much smaller than the number of auxiliary spacers.

In some embodiments, when the display panel is not subjected to any external pressure, a surface of the main spacer away from the second substrate 22 may be in contact with the array substrate and substantially play a supporting role. When the display panel is not subjected to any external pressure, there is a gap between a surface of the auxiliary spacer away from the second substrate 22 and the array substrate, as shown in FIG. 8. In other words, there is a step difference between the surface of the main spacer away from the second substrate 22 and the surface of the auxiliary spacer away from the second substrate 22, and the thickness of the display panel may be fine-tuned by adjusting the step difference between the main spacer and the auxiliary spacer. In some embodiments, when the display panel is subjected to external pressure, the main spacer first withstand all the pressure and compressed. When the main spacer is compressed to a point where the step difference between the main spacer and the auxiliary spacer drops to zero, the main spacer and the auxiliary spacer jointly bear the external pressure.

In some embodiments of the disclosure, a part of the spacer 20 may be located in the display area of the display panel, and another part may be located in the non-display area of the display panel. In some embodiments, in order to ensure the consistency of the thickness between the display area and the non-display area to avoid the Mura-related image quality problems of the wireframe, as shown in the drawings, the orthographic projection of the surface of the spacer 20 in the display area close to the array substrate on the first substrate 10 may be located in the orthographic projection of the non-patterned portion 172 of the planarization layer 17 on the first substrate 10, thereby ensuring the structure and thickness of the film layer at the supporting position of the spacer 20 are basically consistency.

Figure 18:
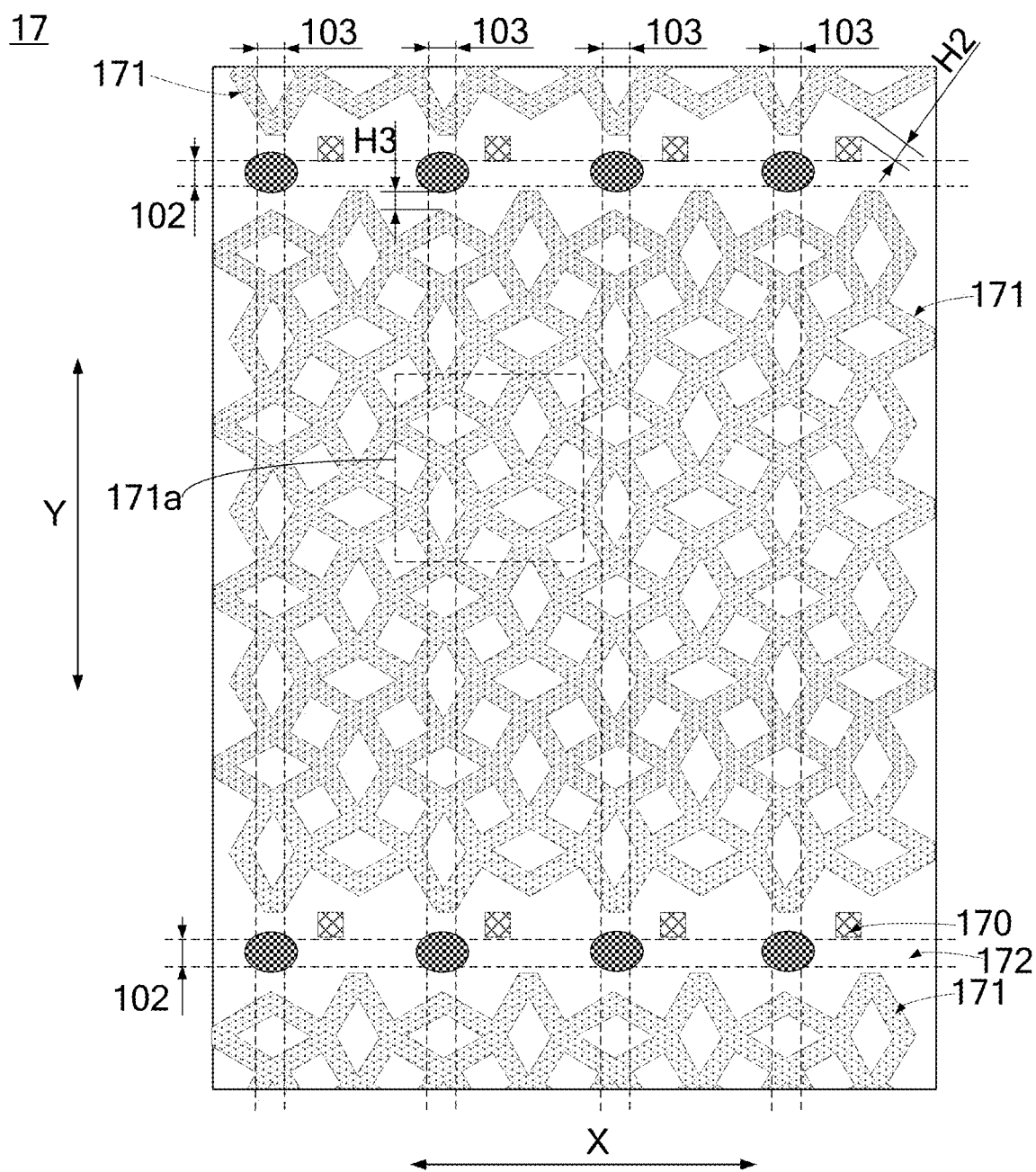
FIG. 18 shows a schematic diagram of the positional relationship between the planarization layer and the spacer according to an embodiment of the disclosure.

It should be understood that the pattern unit 171a should avoid the surface of the spacer close to the array substrate. Considering process fluctuations, the distance H3 (as shown in FIG. 18) between the surface of the spacer close to the array substrate and the spacing groove 1711 of the pattern unit 171a is formed greater than or equal to 5 µm, thereby ensuring the consistency of the cell thickness between the display area and the non-display area during the pressure or drop test, so as to avoid the Mura-related image quality problems of the wire frame.

Figure 19:
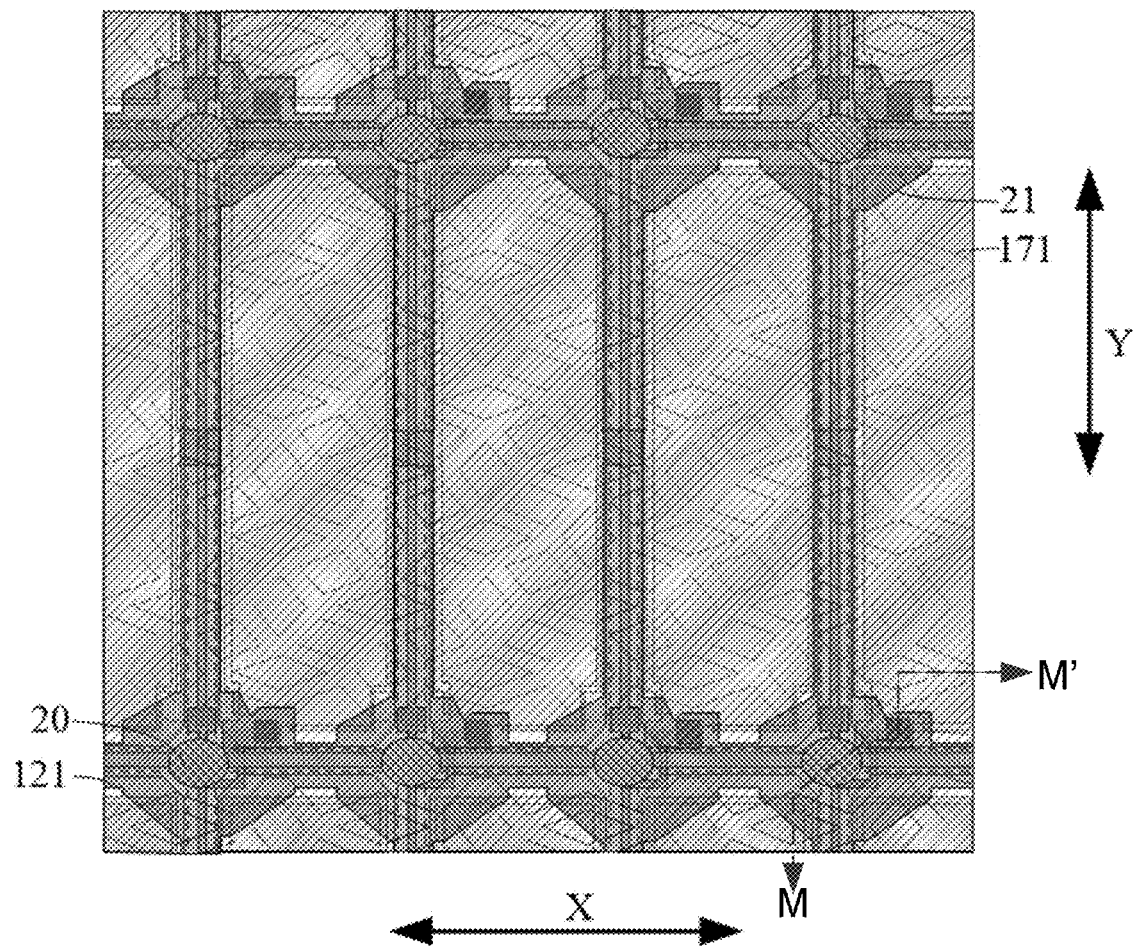
FIG. 19 shows a schematic structural diagram of a display panel according to an embodiment of the disclosure.
Figure 20:
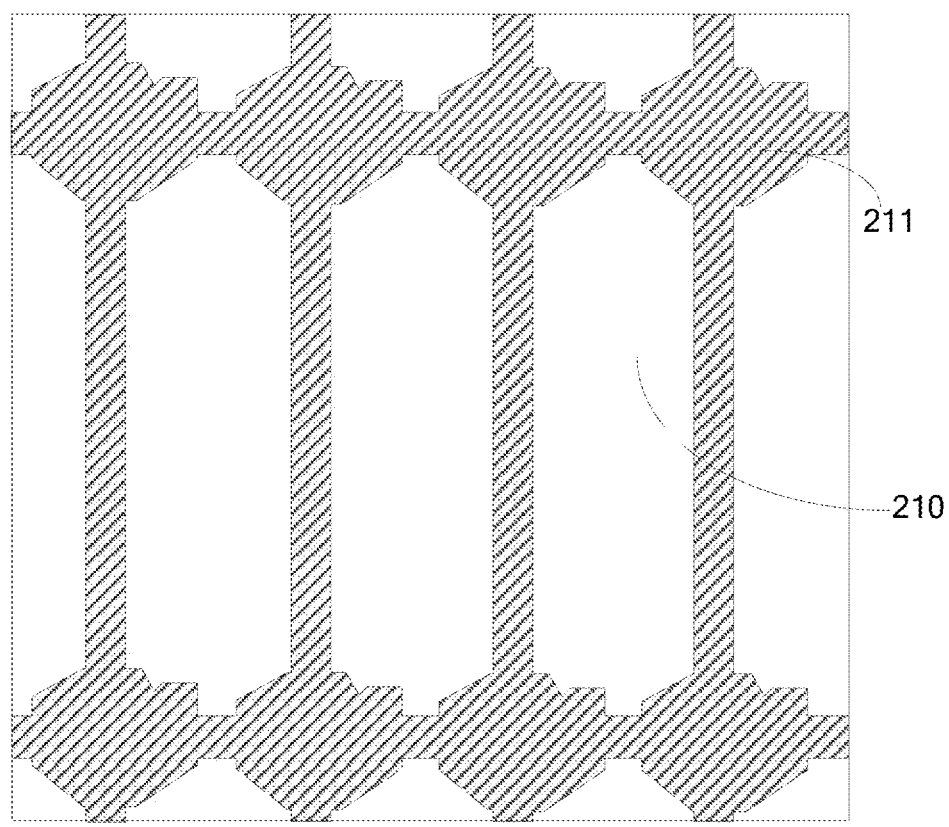
FIG. 20 shows a schematic structural diagram of the shielding layer shown in FIG. 19.

In some embodiments of the disclosure, as shown in FIG. 19 and FIG. 20, the opposing substrate may further include a shielding layer 21 (i.e., black matrix BM) located between the spacer 20 and the second substrate 22. In other words, when fabricating the opposing substrate, the shielding layer 21 may be fabricated on the second substrate 22 first, and then the spacer 20 may be fabricated. In some embodiments, the shielding layer 21 is provided with a plurality of opening areas 210 arranged in an array, and the orthographic projection of each opening area 210 on the first substrate 10 is located in a sub-pixel region 101, and is located in the orthographic projection of the reflective electrode 18 and the pattern portion 171 on the first substrate 10. Since the pattern units 171a of the pattern portion 171 are continuously arranged, the pattern units 171a may fill the opening area 210 as much as possible, so that the uneven part of the reflective electrode 18 fills the opening area 210 as much as possible to ensure the reflection effect.

It should be understood that, in the shielding layer 21 in some embodiments of the disclosure, except for the aforementioned opening area 210, the remaining area is the shielding area 211. The orthographic projection of the shielding area 211 on the first substrate 10 should cover the orthographic projections of the transistor 11, the first via hole 170, the data line 14, the gate line 13, and the spacer 20 on the first substrate 10. In other words, the orthographic projections of the transistor 11, the first via hole 170, the data line 14, the gate line 13, and the spacer 20 on the first substrate 10 are located within the orthographic projection of the shielding area 211 on the first substrate 10. In some embodiments, the shielding area 211 may also cover a part of the storage capacitor 12 and a part of the reflective electrode 18. In other words, the orthographic projection of the shielding area 211 on the first substrate 10 may cover the entire first wiring region 102, the entire second wiring region 103, and a part of the sub-pixel region 101. It should be noted that the shielding area 211 may also cover non-display area.

In some embodiments of the disclosure, as shown in FIG. 21 and FIG. 22, the opposing substrate may further include a color film layer, a protective film layer 24, and a common electrode layer 25.

In some embodiments, the color film layer may be located between the spacer 20 and the second substrate 22. In other words, when the opposing substrate is prepared, the color film layer may be fabricated on the second substrate 22 first, and then the spacer 20 may be fabricated. More specifically, when preparing the opposing substrate, the shielding layer 21 may be formed on the second substrate 22 first, and then the color film layer may be formed, and then the spacer 20 may be formed. The color film layer may include a plurality of filter blocks 23, and the plurality of filter blocks 23 include, for example, red (R), green (G), and blue (B) filter blocks 23. At least part of the filter blocks 23 are located in the opening area 210. It should be noted that each opening area 210 may be provided with red (R), green (G), and blue (B) filter blocks 23 correspondingly, but it is not limited thereto, and each opening area 210 may also be correspondingly provided with one filter block 23.

The protective film layer 24 may be located at one side of the color filter layer and the shielding layer 21 away from the second substrate 22, and at one side of the spacer 20 close to the second substrate 22. In other words, when the opposing substrate is prepared, the shielding layer 21 and the color film layer may be sequentially formed on the second substrate 22, and then the protective film layer 24 may be formed, and then the spacer 20 may be formed. In some embodiments, the protective film layer 24 may cover the color film layer and the shielding layer 21, so as to protect the color film layer and the shielding layer 21. For example, the material of the protective film layer 24 may be optical resin glue, but it is not limited thereto, and may also be other materials, depending on the specific situation.

The common electrode layer 25 may be located between the protective film layer 24 and the spacer 20. In other words, when the opposing substrate is prepared, the shielding layer 21, the color film layer, and the protective film layer 24 may be sequentially formed on the second substrate 22, then the common electrode layer 25 is formed, and then the spacer 20 is formed. The common electrode layer 25 is configured to apply a reference voltage, and the liquid crystal molecules may be driven to deflect under the action of the common electrode layer 25 and the reflective electrode 18.

For example, the common electrode layer 25 may be a transparent electrode layer, and the material of the common electrode layer 25 may be ITO or the like, but is not limited thereto, and may also be other conductive materials.

In addition, it should be noted that the opposing substrate may also include an alignment film. The alignment film may be formed after the spacer 20 is formed, but it is not limited thereto. It can also be formed after the common electrode layer 25 is formed and before the spacer 20 is formed, depending on the specific situation.

It should be understood that the opposing substrate in some embodiments of the disclosure may be not provided with the color filter layer, and the color filter layer may be located in the array substrate.

Some embodiments of the disclosure further provides an electronic device, which includes the display panel described in any one of the foregoing embodiments. The electronic device in some embodiments of the disclosure adopts RLCD technology.

It should be noted that in addition to the aforementioned display panel, the electronic device may also include other components, such as polarizers, batteries, motherboards, casings, and the like, which may be adopted by those skilled in the art according to the usage requirements and will not be repeated here.

In the embodiments of the disclosure, the specific types of electronic devices are not particularly limited. The types of electronic devices commonly used in the field may be used, such as electronic tags, e-books, smart wearable devices, smart retail devices, and the like, which may be selected by those skilled in the art according to the specific purpose of the electronic device and will not be repeated here.

Those skilled in the art will easily think of other embodiments of the disclosure after considering the specification and practicing the disclosure as described herein. The disclosure is intended to cover any variations, uses, or adaptive changes of the disclosure, which follow the general principles of the disclosure and include common knowledge or conventional technical means in the technical field that are not disclosed in the disclosure. The description and the embodiments are only regarded as exemplary, and the scope and spirit of the disclosure are pointed out by appended claims.

What is claimed is:

1. An array substrate, comprising:
a first substrate (10), comprising a plurality of sub-pixel regions (101) arranged in an array along a row direction (X) and a column direction (Y);
a pixel circuit layer formed on the first substrate (10), comprising a plurality of sub-pixel circuits, wherein at least part of the sub-pixel circuits is located in the sub-pixel regions (101);
a planarization layer (17) formed on the pixel circuit layer, wherein the planarization layer (17) is provided with a first via hole (170) located in the sub-pixel regions (101), and comprises at least one pattern portion (171), the pattern portion (171) comprises a plurality of pattern units (171a) arranged in an array along the row direction (X) and the column direction (Y), and the pattern unit (171a) is uneven and located at least in the sub-pixel regions (101); wherein the pattern unit (171a) comprises a plurality of first bumps (1710) arranged along a circumferential direction (C) of the pattern unit (171a) and an spacing groove (1711) surrounding each of the first bumps (1710), and a part of the spacing groove (1711) is shared by two adjacent first bumps (1710) in the circumferential direction (C); and
a reflective electrode layer formed on the planarization layer (17), wherein the reflective electrode layer comprises a plurality of reflective electrodes (18) that are mutually disconnected, each of the reflective electrodes (18) is located in one of the sub-pixel regions (101) and is electrically connected to the sub-pixel circuit through the first via hole (170), and a portion of the reflective electrode (18) corresponding to the pattern unit (171a) is in an uneven shape matching the pattern unit (171a),
wherein,
the first substrate (10) further comprises multiple rows of first wiring regions (102) and multiple columns of second wiring regions (103), the first wiring regions (102) and each row of sub-pixel regions (101) are alternately arranged in the column direction (Y), and the second wiring regions (103) and each column of the sub-pixel regions (101) are alternately arranged in the row direction (X);
the pixel circuit layer further comprises multiple rows of gate lines (13) and multiple columns of data lines (14), the gate lines (13) are located in the first wiring regions (102), the data lines (14) are located in the second wiring regions (103), and the gate lines (13) and the data lines (14) are respectively electrically connected to the sub-pixel circuit,
the sub-pixel circuit comprises a storage capacitor (12) and a transistor (11);
the storage capacitor (12) is located in the sub-pixel region (101), and comprises a first electrode plate (121) and a second electrode plate (122) that are opposite to each other in a thickness direction (Z) of the first substrate (10), the first electrode plate (121) and the gate line (13) are arranged in a same layer and disconnected from each other, the second electrode plate (122) and the data line (14) are arranged in a same layer and disconnected from each other, and the second electrode plate (122) is connected to the reflective electrode (18) through the first via hole (170);
the transistor (11) comprises an active layer (110), a gate (111), a source (112) and a drain (113); the active layer (110) is located at one side of the gate line (13) near the first substrate (10), and comprises a first active portion (1101) located in the second wiring region (103), a second active portion (1102) opposite to the first active portion (1101) in the row direction (X), and a third active portion (1103) at least located in the sub-pixel region (101); an orthographic projection of the first active portion (1101) on the first substrate (10) at least partially overlaps with an orthographic projection of the gate line (13) on the first substrate (10); a first end of the first active portion (1101) is located at one side of the gate line (13) away from the third active portion (1103), and a second end of the first active portion (1101) is connected to a first end of the third active portion (1103); a first end and a second end of the second active portion (1102) are respectively located in two adjacent sub-pixel regions (101) in the row direction (X), the first end of the second active portion (1102) is located at one side of the gate line (13) away from the third active portion (1103), and the second end of the second active portion (1102) is connected to a second end of the third active portion (1103); and the gate (111) of the transistor (11) is formed by a part of the gate lines (13) overlapping with the first active portion (1101) and the second active portion (1102) in the thickness direction (Z) of the first substrate (10), the source (112) of the transistor (11) is formed by a part of the data lines (14) overlapping with the first end of the first active portion (1101) in the thickness direction (Z) of the first substrate (10), the source (112) is connected to the first end of the first active portion (1101) through the second via hole (160), the drain (113) of the transistor (11) is formed by a part of the second electrode plate (122) overlapping with the first end of the second active portion (1102) in the thickness direction (Z) of the first substrate (10), and the drain (113) is connected to the first end of the second active portion (1102) through the third via hole (161).

2. The array substrate according to claim 1, wherein in the circumferential direction (C) of the pattern unit (171a), extension directions of the first symmetry axis (a) corresponding to two adjacent symmetric patterns intersect with each other.

3. The array substrate according to claim 2, wherein in the circumferential direction (C) of the pattern unit (171a), the extension directions of the first symmetry axis (a) corresponding to two adjacent symmetric patterns are perpendicular to each other.

4. The array substrate according to claim 3, wherein the pattern unit (171a) comprises four of the first bumps (1710), and in the circumferential direction (C) of the pattern unit (171a), the first symmetry axis (a) of one of two symmetric patterns corresponding to two adjacent first bumps (1710) is collinear with the second symmetry axis (b) of another one of the two symmetric patterns.

5. The array substrate according to claim 4, wherein in the circumferential direction (C) of the pattern unit (171a), the first symmetry axis (a) of one of two symmetric patterns corresponding to two adjacent first bumps (1710) extends in the row direction (X), and the first symmetry axis (a) of another one of the two symmetric patterns extends in the column direction (Y).

6. The array substrate according to claim 1, wherein symmetry axes of the symmetry pattern consist of only the first symmetry axis (a) and the second symmetry axis (b); and/or
wherein the symmetrical pattern is rhombus, rectangle, ellipse or octagon.

7. The array substrate according to claim 1, wherein a ratio of the length (L1) of the first symmetry axis (a) of the symmetric pattern to the length (L2) of the second symmetry axis (b) of the first bump (1710) is 1.5 to 2.5; and/or
wherein the length (L2) of the second symmetry axis (b) is 6 μm to 10 μm.

8. The array substrate according to claim 1, wherein the pattern unit (171a) further comprises a second bump (1712) located within a central area surrounded by each of the first bumps (1710); and
wherein a part of each of the spacing grooves (1711) in the pattern unit (171a) close to the second bump (1712) is connected end to end in sequence along the circumferential direction (C) to surround the second bump (1712).

9. The array substrate according to claim 8, wherein slope angles (γ) of the first bump (1710) and the second bump (1712) are both 6° to 13°; and/or
wherein a maximum thickness of the first bump (1710) is the same as a maximum thickness of the second bump (1712).

10. The array substrate according to claim 8, wherein, in the circumferential direction (C) of the pattern unit (171a), a minimum distance between any two adjacent first bumps (1710) is a first distance (S1), and the a minimum distance between the second bump (1712) and the first bump (1710) in the pattern unit (171a) is a second distance (S2); and
wherein a ratio of the first distance (S1) to the second distance (S2) is 1 to 1.5, and/or the second distance (S2) is 1.5 μm to 5 μm.

11. The array substrate according to claim 1, wherein at position of the spacing groove (1711), a thickness (H1) of the planarization layer (17) is greater than or equal to 1 μm; and/or
wherein a distance (H2) between the first via hole (170) and the spacing groove (1711) is greater than or equal to 5 μm.

12. A display panel, comprising an array substrate and an opposing substrate arranged in an opposing way with respect to the array substrate, wherein the array substrate comprises:
a first substrate (10), comprising a plurality of sub-pixel regions (101) arranged in an array along a row direction (X) and a column direction (Y);
a pixel circuit layer formed on the first substrate (10), comprising a plurality of sub-pixel circuits, wherein at least part of the sub-pixel circuits is located in the sub-pixel regions (101);
a planarization layer (17) formed on the pixel circuit layer, wherein the planarization layer (17) is provided with a first via hole (170) located in the sub-pixel regions (101), and comprises at least one pattern portion (171), the pattern portion (171) comprises a plurality of pattern units (171a) arranged in an array along the row direction (X) and the column direction (Y), and the pattern unit (171a) is uneven and located at least in the sub-pixel regions (101); wherein the pattern unit (171a) comprises a plurality of first bumps (1710) arranged along a circumferential direction (C) of the pattern unit (171a) and an spacing groove (1711) surrounding each of the first bumps (1710), and a part of the spacing groove (1711) is shared by two adjacent first bumps (1710) in the circumferential direction (C); and
a reflective electrode layer formed on the planarization layer (17), wherein the reflective electrode layer comprises a plurality of reflective electrodes (18) that are mutually disconnected, each of the reflective electrodes (18) is located in one of the sub-pixel regions (101) and is electrically connected to the sub-pixel circuit through the first via hole (170), and a portion of the reflective electrode (18) corresponding to the pattern unit (171a) is in an uneven shape matching the pattern unit (171a), wherein,
the first substrate (10) further comprises multiple rows of first wiring regions (102) and multiple columns of second wiring regions (103), the first wiring regions (102) and each row of sub-pixel regions (101) are alternately arranged in the column direction (Y), and the second wiring regions (103) and each column of the sub-pixel regions (101) are alternately arranged in the row direction (X);
the pixel circuit layer further comprises multiple rows of gate lines (13) and multiple columns of data lines (14), the gate lines (13) are located in the first wiring regions (102), the data lines (14) are located in the second wiring regions (103), and the gate lines (13) and the data lines (14) are respectively electrically connected to the sub-pixel circuit,
the sub-pixel circuit comprises a storage capacitor (12) and a transistor (11);
the storage capacitor (12) is located in the sub-pixel region (101), and comprises a first electrode plate (121) and a second electrode plate (122) that are opposite to each other in a thickness direction (Z) of the first substrate (10), the first electrode plate (121) and the gate line (13) are arranged in a same layer and disconnected from each other, the second electrode plate (122) and the data line (14) are arranged in a same layer and disconnected from each other, and the second electrode plate (122) is connected to the reflective electrode (18) through the first via hole (170);
the transistor (11) comprises an active layer (110), a gate (111), a source (112) and a drain (113); the active layer (110) is located at one side of the gate line (13) near the first substrate (10), and comprises a first active portion (1101) located in the second wiring region (103), a second active portion (1102) opposite to the first active portion (1101) in the row direction (X), and a third active portion (1103) at least located in the sub-pixel region (101); an orthographic projection of the first active portion (1101) on the first substrate (10) at least partially overlaps with an orthographic projection of the gate line (13) on the first substrate (10); a first end of the first active portion (1101) is located at one side of the gate line (13) away from the third active portion (1103), and a second end of the first active portion (1101) is connected to a first end of the third active portion (1103); a first end and a second end of the second active portion (1102) are respectively located in two adjacent sub-pixel regions (101) in the row direction (X), the first end of the second active portion (1102) is located at one side of the gate line (13) away from the third active portion (1103), and the second end of the second active portion (1102) is connected to a second end of the third active portion (1103); and
the gate (111) of the transistor (11) is formed by a part of the gate lines (13) overlapping with the first active portion (1101) and the second active portion (1102) in the thickness direction (Z) of the first substrate (10), the source (112) of the transistor (11) is formed by a part of the data lines (14) overlapping with the first end of the first active portion (1101) in the thickness direction (Z) of the first substrate (10), the source (112) is connected to the first end of the first active portion (1101) through the second via hole (160), the drain (113) of the transistor (11) is formed by a part of the second electrode plate (122) overlapping with the first end of the second active portion (1102) in the thickness direction (Z) of the first substrate (10), and the drain (113) is connected to the first end of the second active portion (1102) through the third via hole (161).

13. The display panel according to claim 12, wherein, the first substrate (10) further comprises multiple rows of first wiring regions (102) and multiple columns of second wiring regions (103), the first wiring regions (102) and each row of sub-pixel regions (101) are alternately arranged in the column direction (Y), and the second wiring regions (103) and each column of the sub-pixel regions (101) are alternately arranged in the row direction (X);
the pixel circuit layer further comprises multiple rows of gate lines (13) and multiple columns of data lines (14), the gate lines (13) are located in the first wiring regions (102), the data lines (14) are located in the second wiring regions (103), and the gate lines (13) and the data lines (14) are respectively electrically connected to the sub-pixel circuit;
the planarization layer (17) further comprises a non-patterned portion (172) at least located in the first wiring region (102), the non-patterned portion (172) extends in the row direction (X), and a surface of the non-patterned portion (172) away from the first substrate (10) is a flat surface; and
the opposing substrate comprises a second substrate (22) and a spacer (20) located at one side of the second substrate (22) close to the array substrate, an orthographic projection of the spacer (20) on the first substrate (10) at least partially overlaps with an overlapping part between the first wiring region (102) and the second wiring region (103), and an orthographic projection of a surface of the spacer (20) close to the array substrate on the first substrate (10) falls within an orthographic projection of the non-patterned portion (172) of the planarization layer (17) on the first substrate (10).

14. The display panel according to claim 13, wherein, a distance (H3) between the surface of the spacer (20) close to the array substrate and the spacing groove (1711) of the pattern unit (171a) is greater than or equal to 5 μm.

15. The display panel according to claim 13, wherein the opposing substrate further comprises a shielding layer (21) located between the spacer (20) and the second substrate (22), the shielding layer (21) is provided with a plurality of opening areas (210) arranged in an array, and an orthographic projection of each of the opening areas (210) on the first substrate (10) falls within one of the sub-pixel regions (101), and within orthographic projections of the reflective electrode (18) and the pattern portion (171) on the first substrate (10).

16. The display panel according to claim 15, wherein the opposing substrate further comprises:
a color film layer located between the spacer (20) and the second substrate (22), comprising a plurality of filter blocks (23) at least partially located in the opening areas (210);
a protective film layer (24) located at one side of the color film layer and the shielding layer (21) away from the second substrate (22), and located at one side of the spacer (20) close to the second substrate (22), wherein the protective film layer (24) covers the color film layer and the shielding layer (21); and
a common electrode layer (25) located between the protective film layer (24) and the spacer (20).

17. An electronic device comprising the display panel according to claim 12.

18. The array substrate according to claim 1, wherein an orthographic projection of the first bump (1710) on the first substrate (10) is a symmetrical pattern, and the symmetrical pattern have at least two symmetry axis comprising a first symmetry axis (a) and a second symmetry axis (b) that are perpendicular to each other, wherein a length (L1) of the first symmetry axis (a) is greater than a length (L2) of the second symmetry axis (b), and the first symmetry axis (a) and the second symmetry axis (b) are perpendicular to a thickness direction (Z) of the array substrate.

* * * * *